United States Patent
Johannessen

(10) Patent No.: US 11,102,858 B2
(45) Date of Patent: Aug. 24, 2021

(54) CONTROLLABLE MICRO LIGHT EMITTING DIODE SYSTEM AND METHOD

(71) Applicant: Rockwell Collins, Inc., Cedar Rapids, IA (US)

(72) Inventor: Eric Johannessen, Holbrook, NY (US)

(73) Assignee: Rockwell Collins, Inc., Cedar Rapids, IA (US)

(*) Notice: Subject to any disclaimer, the term of this patent is extended or adjusted under 35 U.S.C. 154(b) by 0 days.

(21) Appl. No.: 16/175,649

(22) Filed: Oct. 30, 2018

(65) Prior Publication Data

US 2020/0137844 A1 Apr. 30, 2020

(51) Int. Cl.
| | |
|---|---|
| *H05B 45/00* | (2020.01) |
| *H05B 45/44* | (2020.01) |
| *B64D 11/00* | (2006.01) |
| *B60Q 3/80* | (2017.01) |
| *B64D 47/02* | (2006.01) |

(52) U.S. Cl.
CPC .......... *H05B 45/00* (2020.01); *H05B 45/44* (2020.01); *B60Q 3/80* (2017.02); *B64D 11/00* (2013.01); *B64D 11/0015* (2013.01); *B64D 47/02* (2013.01); *B64D 2011/0038* (2013.01); *B64D 2011/0053* (2013.01); *B64D 2203/00* (2013.01)

(58) Field of Classification Search
None
See application file for complete search history.

(56) References Cited

U.S. PATENT DOCUMENTS

| | | | |
|---|---|---|---|
| 6,837,605 B2 | 1/2005 | Reill | |
| 8,274,226 B1* | 9/2012 | Sikora | B60Q 1/24 315/77 |
| 2008/0030149 A1* | 2/2008 | Callahan | H05B 45/20 315/291 |
| 2009/0309501 A1* | 12/2009 | Catalano | H05B 47/185 315/158 |
| 2011/0050101 A1 | 3/2011 | Bailey et al. | |
| 2013/0002141 A1* | 1/2013 | Lee | H05B 45/48 315/152 |

* cited by examiner

*Primary Examiner* — Dedei K Hammond
(74) *Attorney, Agent, or Firm* — Suiter Swantz pc llo

(57) ABSTRACT

A variable geometry light source and related method for illumination comprises a dense array of micro light emitting diodes (LED) incorporated within a printed circuit board and controlled by an incorporated microcontroller. The microcontroller receives user input and causes the dense array to illuminate according to the input. A tunable lens operates to focus the LED illumination toward one or more specific target subjects creating a variable geometry light projection. The microcontroller is configured with instructions which cause the dense array to produce a variety of shapes, intensities, and color temperatures tailored to the individual installation. The microcontroller causes the dense array to create a light projection suitable for illumination of a subject as well as a dynamic projection animated for a communication to the viewer.

8 Claims, 27 Drawing Sheets

CONTROLLABLE MICRO LIGHT EMITTING DIODE SYSTEM AND METHOD

BACKGROUND

Noon Personal lighting devices may cause a number of challenges when installed within an overhead compartment of a personal space. A personal lighting device may offer a person a light source for illuminating a subject of interest. For example, a passenger on an aircraft or ground based vehicle may desire illumination of a book or map while an engineer in a lab may desire a controllable illumination of a circuit board. Additionally, a medical professional may desire controllable illumination of a particular point on a subject of interest.

A light source may produce heat requiring additional function of the light source to ensure fire compliance and safely remove the heat. In the aircraft example, heat build up in the overhead compartment may cause additional problems of the aircraft operator.

Users may desire controllability function not found in current light sources. For example, a dentist must physically touch her light source and manipulate the direction of the source to a desired illumination point on the subject. This touch may introduce undesirable bacteria as the dentist resumes work after light source adjustment.

Passengers nearby a personal light user may experience undesirable light pollution from a light source used by a specific passenger. Some passengers may find it difficult to fall asleep as their neighbor is brightly illuminating a subject.

An operator of the vehicle may be required to maintain multiple fixtures increasing cost and time for maintenance. With reference to the number of required fixtures in the cabin of an aircraft, the operator must maintain each fixture causing costly delay or equipment substitution should one or more of the fixtures become inoperative.

Therefore, a need remains for a system and related method for providing controlled illumination of a subject of interest within personal space.

SUMMARY

In one aspect, embodiments of the inventive concepts disclosed herein are directed to a variable geometry light source. The variable geometry light source comprises a microcontroller configured for receiving a user input and producing an illumination data signal based on the user input. The microcontroller including at least one processor, a memory, and a storage. The variable geometry light source includes a power receiver operatively coupled with the microcontroller and configured for supplying power to the elements of the variable geometry light source.

To produce controlled illumination, the variable geometry light source may use a dense array of light emitting diodes (LED), operatively coupled with the microcontroller and the power receiver. The LED are driven by a driver, operatively coupled with the microcontroller, the dense array of LED, and the power receiver. The driver may receive the regulated portion of electrical power, receive the illumination data signal and drive one or more LED within the dense array of LED to produce the controlled illumination based on the illumination data signal. In addition, a tunable lens may be configured for focusing the controlled illumination based on a selectable focus, the focusing producing a selectable variable geometry light pattern.

In one embodiment of the inventive concepts disclosed herein, the microcontroller, the power receiver, the dense array of LED, and the at least one driver are housed upon a single printed circuit board.

In an additional embodiment of the inventive concepts disclosed herein, the illumination data signal includes a signal to illuminate one of: an adjacent one or more, a distant one or more, and a combination of the adjacent and distant ones of the at least one LED. In one embodiment of the inventive concepts disclosed herein, the selectable variable geometry light pattern is produced with no use of a Liquid Crystal Display (LCD), a Digital Light Processing (DLP) light engine, or a digital micromirror device. In one embodiment of the inventive concepts disclosed herein, the at least one driver is a metal-oxide semiconductor field-effect transistor (MOSFET) configured to individually control each LED of the dense array of LED.

In an additional embodiment of the inventive concepts disclosed herein, the at least one driver is a second microcontroller configured to individually control each LED of the dense array of LED. In one embodiment of the inventive concepts disclosed herein, the variable geometry light source is sized to maintain an outside diameter of 1.5 inches or less.

In one embodiment of the inventive concepts disclosed herein, the selectable variable geometry light pattern is configured to replace at least one required illumination source within a cabin of a vehicle. In one embodiment of the inventive concepts disclosed herein, the selectable variable geometry light pattern is configured to replace at least one required illumination source designed to project externally from a vehicle.

In an additional embodiment of the inventive concepts disclosed herein, the illumination data signal causes the selectable variable geometry light pattern to produce a communication to a viewer of the pattern. In one embodiment of the inventive concepts disclosed herein, wherein the tunable lens maintains a fixed shape as the variable geometry light source is operational.

A further embodiment of the inventive concepts disclosed herein may include a method for illuminating a subject, comprising receiving a user input within a microcontroller, the microcontroller including at least one processor, a memory, and a storage. The microcontroller may produce producing an illumination data signal based on the user input, the illumination data signal configured to control a dense array of light emitting diodes (LED). The method may receive the illumination data signal within at least one driver, the at least one driver operatively coupled with the microcontroller and the dense array of LED. The method may drive at least one LED within the dense array of LED to produce a controlled illumination based on the illumination data signal, and focus the controlled illumination with a tunable lens based on a selectable focus, the focus producing a selectable variable geometry light pattern.

An additional embodiment of the inventive concepts disclosed herein may be directed to a method for illuminating a subject, wherein receiving a user input within a microcontroller further comprises receiving an input from one of: a button input, a switched input, a toggle switch input, a voice recognition input, a motion sensed input, and an automatic input based on a selectable set of parameters.

An additional embodiment of the inventive concepts disclosed herein may be directed to a method for illuminating a subject, wherein producing an illumination data signal further comprises a data signal configured for illumination or extinguishing at least one LED within the dense array of LED.

An additional embodiment of the inventive concepts disclosed herein may be directed to a method for illuminating a subject, wherein receiving the illumination data signal within at least one driver further comprises receiving within the illumination data signal within one of: a MOSFET driver and a second microcontroller driver.

An additional embodiment of the inventive concepts disclosed herein may be directed to a method for illuminating a subject, wherein driving at least one LED within the dense array of LED further comprises driving at least one LED of the dense array of LED to illuminate one of: an adjacent one or more, a distant one or more, and a combination of the adjacent and distant ones of the at least one LED.

An additional embodiment of the inventive concepts disclosed herein may be directed to a method for illuminating a subject, wherein producing a selectable variable geometry light pattern further comprises producing the selectable variable geometry light pattern with no use of a Liquid Crystal Display (LCD), a Digital Light Processing (DLP) light engine, or a digital micromirror device.

An additional embodiment of the inventive concepts disclosed herein may be directed to a method for illuminating a subject, wherein the illumination data signal causes the selectable variable geometry light pattern to produce a communication to a viewer of the pattern.

An additional embodiment of the inventive concepts disclosed herein may be directed to a method for illuminating a subject, wherein the communication further comprises a signal configured for a viewer within one of: a vehicle and a structure.

An additional embodiment of the inventive concepts disclosed herein may be directed to a method for illuminating a subject, wherein the communication further comprises a signal configured for a viewer external to one of: a vehicle and a structure.

It is to be understood that both the foregoing general description and the following detailed description are exemplary and explanatory only and are not necessarily restrictive of the inventive concepts as claimed. The accompanying drawings, which are incorporated in and constitute a part of the specification, illustrate embodiments of the inventive concepts and together with the general description, serve to explain the principles of the inventive concepts disclosed herein.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings in which.

DETAILED DESCRIPTION OF EXEMPLARY EMBODIMENTS

Figure 1:
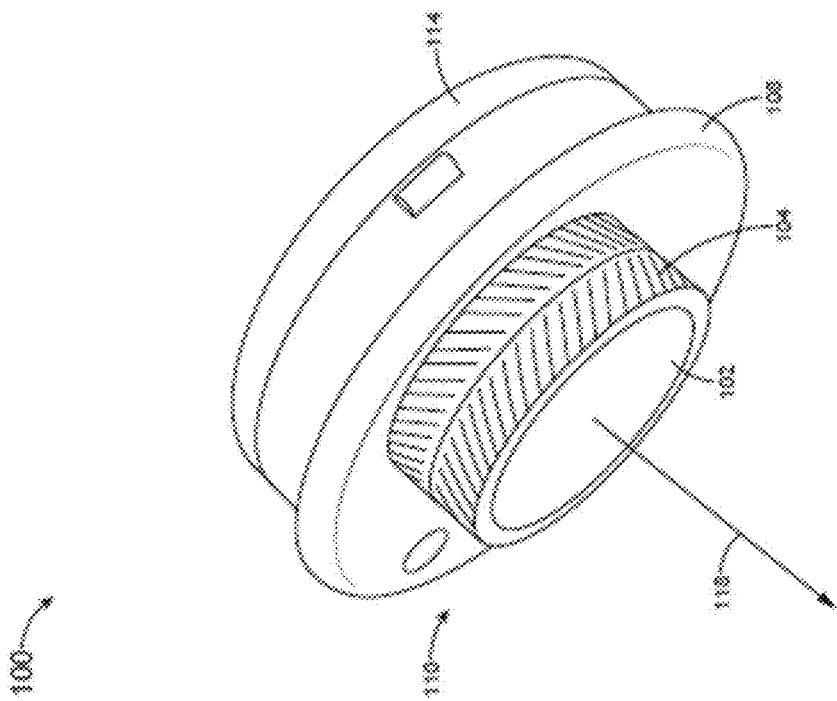
FIG. 1 is a diagram of a variable geometry light source in accordance with an embodiment of the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

OVERVIEW

Broadly, embodiments of the inventive concepts disclosed herein are directed to a variable geometry light source and related method for illumination comprises a dense array of micro light emitting diodes (LED) incorporated within a printed circuit board and controlled by an incorporated microcontroller. The microcontroller receives user input and causes the dense array to illuminate according to the input. A tunable lens operates to focus the LED illumination toward one or more specific target subjects creating a variable geometry light projection. The microcontroller is configured with instructions which cause the dense array to produce a variety of shapes, intensities, and color temperatures tailored to the individual installation. The microcontroller causes the dense array to create a light projection suitable for illumination of a subject as well as a dynamic projection animated for a communication to the viewer.

REFERENCE CHART

| | |
|---|---|
| 110 | Variable Geometry Light Source |
| 100 | Side view |
| 102 | Close Out Lens |
| 104 | Knurled Handle |
| 106 | Tunable Lens |
| 108 | Lower Housing Assembly |
| 112 | Printed Circuit Board |
| 114 | Gap Pad |
| 116 | Upper Housing |
| 118 | Illumination |
| 120 | Power Supply |
| 122 | Input Power |
| 124 | Power Regulator |
| 130 | Left Driver FETS |
| 140 | Right Driver FETS |
| 150 | Power Inputs |
| 160 | Program Pins |
| 180 | Dense LED Array |
| 200 | Exploded View |
| 300 | Top view of the PCB |
| 310 | Microcontroller |
| 312 | Processor |
| 314 | Memory |
| 316 | Storage |
| 400 | Schematic View |
| 422 | Power Supply 28 v |
| 424 | Power Return |
| 426 | Power Reference Inputs |
| 432 | Switching Regulator |
| 434 | Low Dropout Regulator |
| 440 | Noise Filter |
| 610 | Microcontroller Driver |
| 918 | Circular Multiple Pattern |
| 920 | Square Pattern |
| 922 | Single Circle Pattern |
| 924 | Oval Pattern |
| 926 | Rectangular Pattern |
| 1020 | Angled pattern |
| 1022 | Focused Angled Pattern |
| 1024 | Starlight Pattern |
| 1100 | Single Aisle Aircraft Longitudinal |
| 1102 | Aircraft Seat |
| 1118 | Focus Distance |
| 1120 | Aircraft Exterior |
| 1130 | Overhead Panel |
| 1132 | Egress Projection |
| 1140 | Aircraft Passenger Deck |
| 1200 | Dual Aisle Aircraft Longitudinal |
| 1310 | Overhead Ceiling |
| 1312 | Egress Projection |
| 1320 | Side Panel |
| 1330 | Overhead Bin |
| 1332 | Logo Projection |
| 1340 | Passenger Service Unit (PSU) |
| 1400 | External Aircraft View |

FIG. 1

Referring now to FIG. 1, a diagram of a variable geometry light source in accordance with an embodiment of the inventive concepts disclosed herein is shown. A side view 100 of the variable geometry light source 110 indicates an upper housing 116, a lower housing assembly 108, a knurled handle 104 and a close out lens 102. The illumination 118 is produced by the variable geometry light source 110 and is configured to illuminate a desired subject.

In one embodiment of the inventive concepts disclosed herein, the variable geometry light source 110 may be configured for incorporation within a variety of applications and use the same part number for each application. One application may be a reading light within the cabin of an aircraft. Another may be a taxi light illuminating externally to the aircraft. Yet another may include projection of an animated logo light on the side of a building. Each application may be limited only by the resolution of the LED density.

FIG. 2

Figure 2:
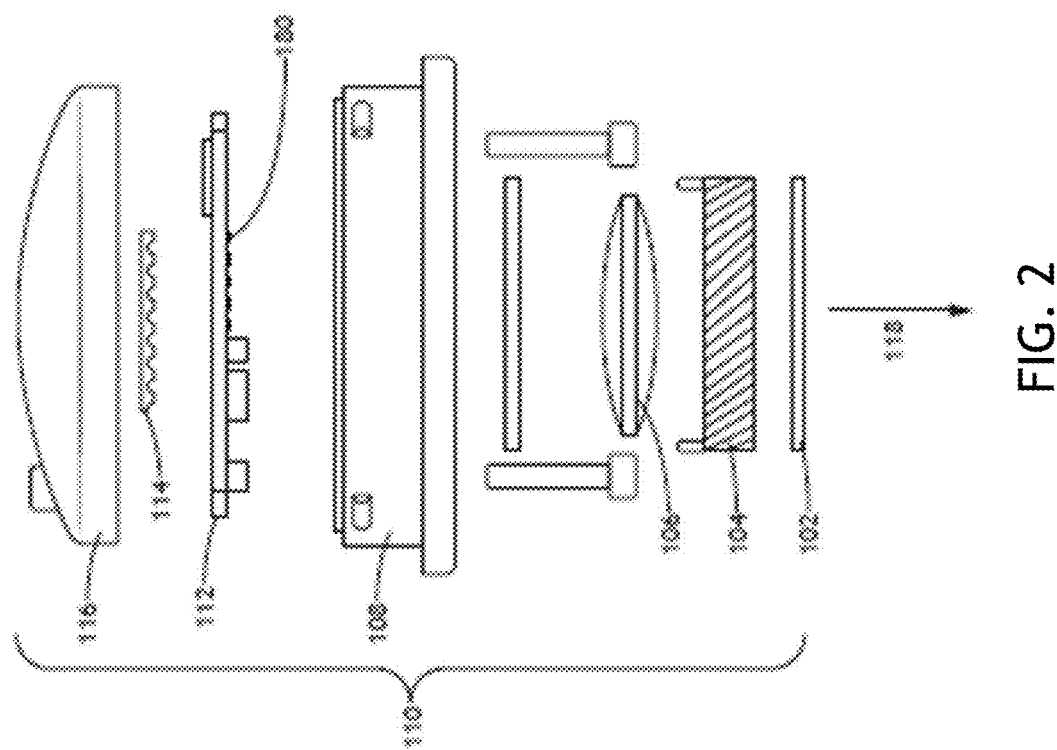
FIG. 2 is an exploded diagram of a variable geometry light source in accordance with an embodiment of the inventive concepts disclosed herein.

Referring now to FIG. 2, a exploded diagram of a variable geometry light source in accordance with an embodiment of the inventive concepts disclosed herein is shown. The variable geometry light source 110 may include the close out lens 102, the knurled handle 104, a tunable lens 106, the lower housing assembly 108, a printed circuit board (PCB) 112 with associated dense array of LED 180, a gap pad 114, and the upper housing 116.

In operation, the variable geometry light source 110 receives power from an onboard power source and projects the illumination 118 via the tunable lens 106 and the close out lens 102. A user may grasp the variable geometry light source 110 via the knurled handle 104 to direct the illumination 118 should the variable geometry light source 110 be mounted on a swivel for increased directional control.

The tunable lens 106 may operate to focus the illumination 118 in a direction or at a distance desired by an operator. The tunable lens 106 may be configured within a manufacturing facility and may retain a fixed geometry once the variable geometry light source 110 leaves the manufacturing facility. In embodiments, the manufacturing facility may tune the tunable lens 106 for a desired performance. For example, a tunable lens 106 designed for an interior cabin application for a single aisle aircraft reading light may differ from a tunable lens 106 designed for an external landing light aircraft operation.

FIG. 3

Figure 3:
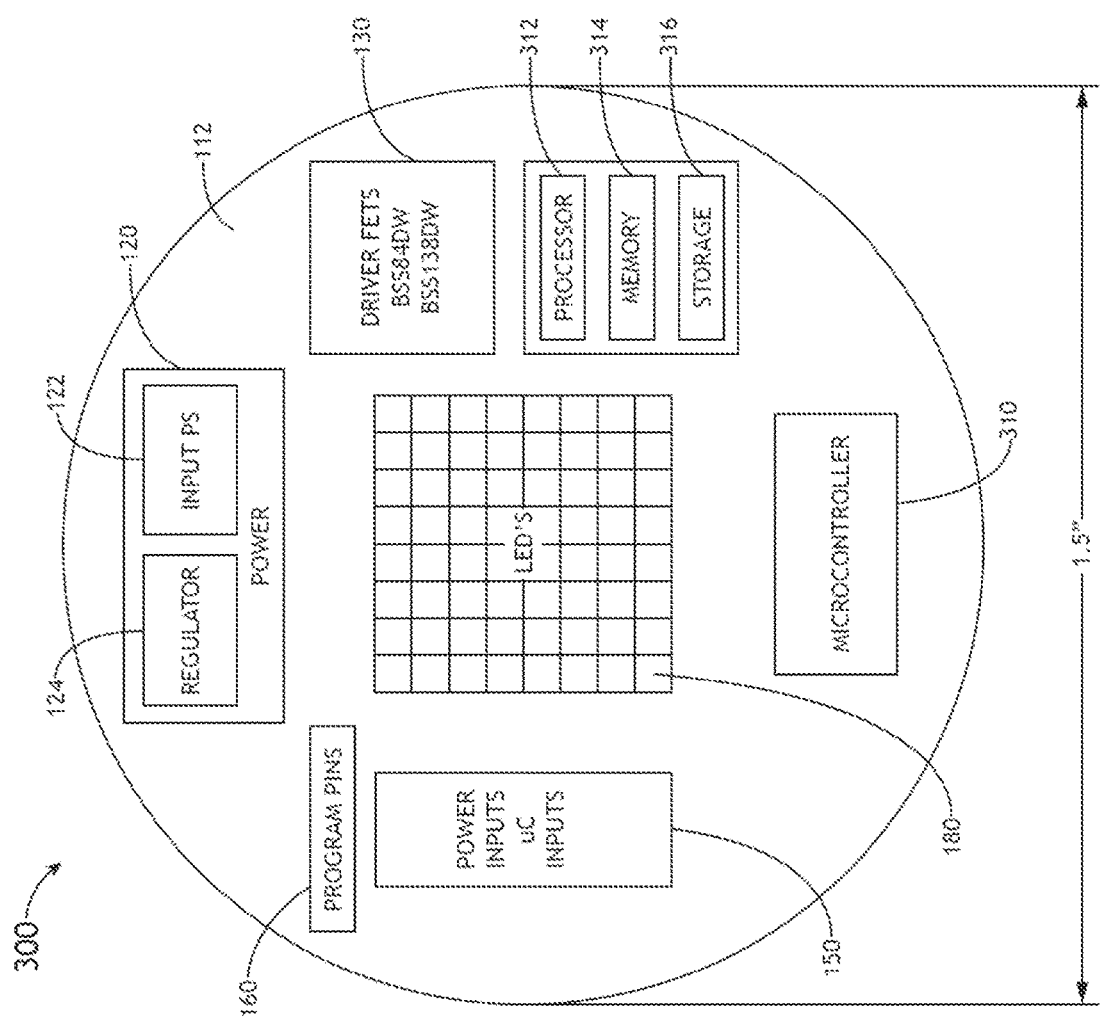
FIG. 3 is a diagram of a printed circuit board employed by the variable geometry light source exemplary of an embodiment of the inventive concepts disclosed herein.

Referring now to FIG. 3, a diagram of a printed circuit board employed by the variable geometry light source exemplary of an embodiment of the inventive concepts disclosed herein is shown. The PCB 112 may function to house each of the elements of the variable geometry light source 110. A power input 120 may include an input power source 122 and a regulator 124. An optional left driver 130 and right driver 140 may provide function to the dense array of LED 180. These left and right metal-oxide semiconductor field-effect transistor (MOSFET) drivers may be optional as one method of driving the dense array of LED 180. Additional options are discussed referring to FIG. 5B.

A microcontroller 310 may function with a processor 312, a memory 314, and a storage 316. Related to the storage, 316, a set of program pins 160 may function to receive manufacturer instructions and apply those received instructions to the storage 316 for variable geometry light source 110 operation. Power inputs and microcontroller inputs 150 may function to receive user inputs and direct the microcontroller 310 to control the operation of the variable geometry light source 110.

In operation, a user may make an input to the microcontroller 310 via the microcontroller inputs 150, the microcontroller 310 may direct the drivers 130 140 to enable or disable one or more LED within the dense array of LED 180. The illumination 118 is directed through the tunable lens 106 and out the close out lens 102 to the desired subject.

In one embodiment of the inventive concepts disclosed herein, the whole of the PCB 112 may be sized to maintain a diameter of 1.5 inches or smaller. In this manner, the variable geometry light source 110 may be configured to replace a plurality of light sources currently in use onboard aircraft and additional vehicles and other applications.

FIG. 4A-4B

Figure 4A:
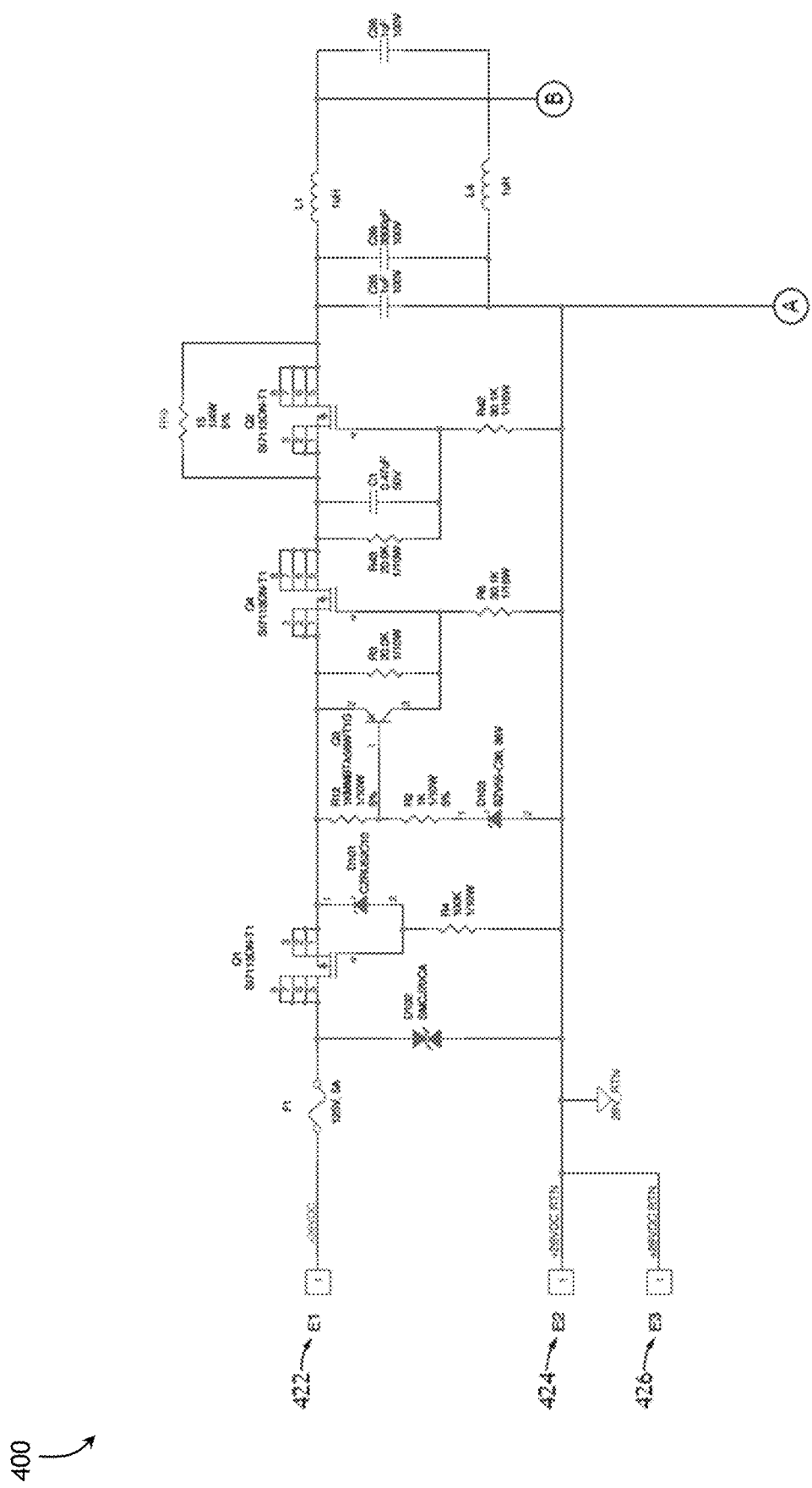
FIG. 4A-4B are schematic diagrams of a variable geometry light source exemplary of one embodiment of the inventive concepts disclosed herein.
Figure 4B:
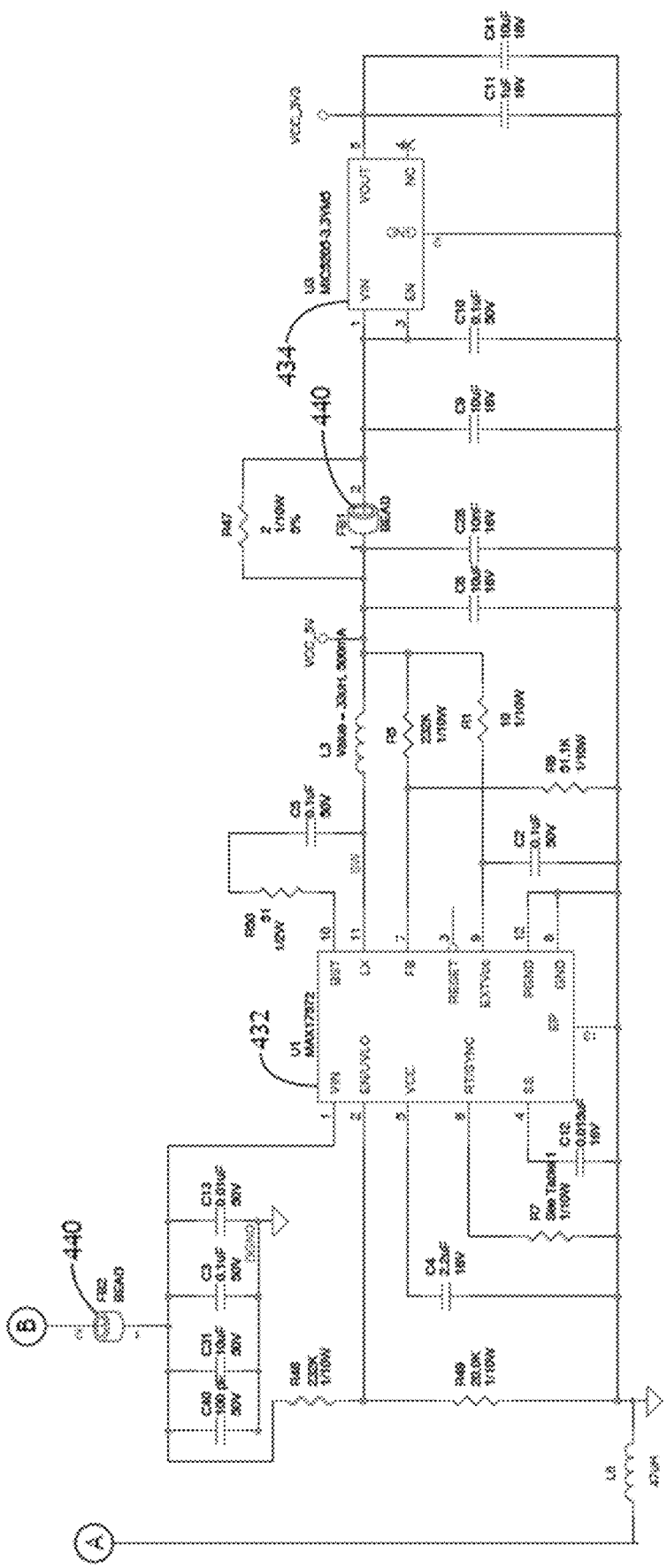

Referring now to FIGS. 4A and 4B, schematic diagrams of a variable geometry light source exemplary of one embodiment of the inventive concepts disclosed herein are shown. Power inputs to the variable geometry light source 110 may include an exemplary 28 VDC input 422 while a power return 424 may operate to provide a negative side of the power. A power reference input 426 may function to receive a user input from a switch to cause the variable geometry light source 110 to operate.

In one embodiment of the inventive concepts disclosed herein, the PCB 112 may include a plurality of MOSFETs for reverse polarity protection, overvoltage and undervoltage protection, and current limiting. Electromagnetic interference noise filter 440 may operate to limit noise from the microcontroller 310. In addition, the variable geometry light source 110 may allow regulator frequencies to be altered to improve efficiency and improve an EMI signature of the dense array of LED 180.

Switching regulator 432 may operate to reduce the 28V input down to 5V for operational use by the dense array of LED 180 as well as additional elements of the variable geometry light source 110. A low dropout regulator 434 may operate to reduce the power from 5V to 3.3V usable by the microcontroller 310 as well as additional elements of the variable geometry light source 110.

FIG. 5A-5B

Figure 5A:
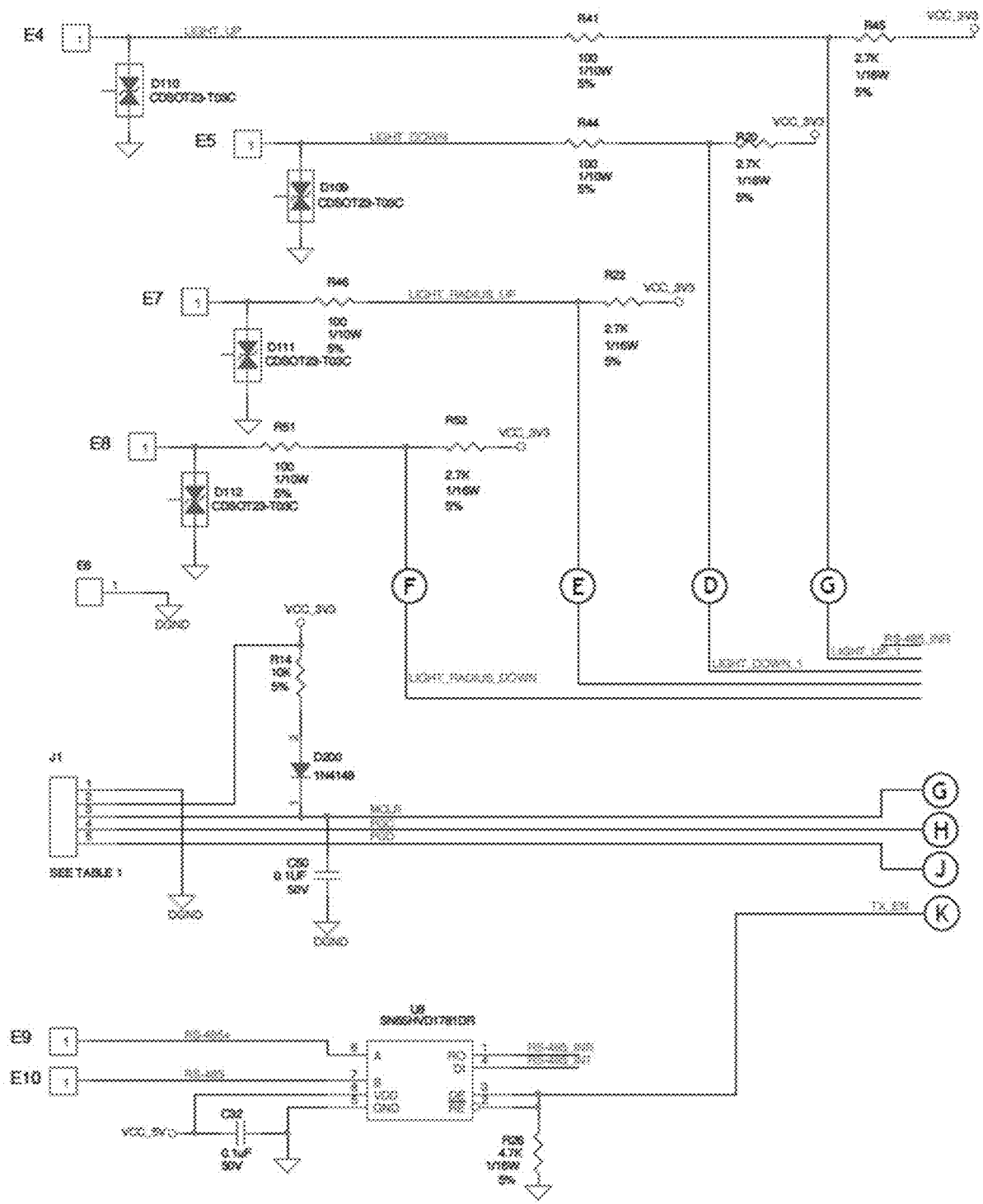
FIG. 5A-5B are schematic diagrams of a variable geometry light source exemplary of one embodiment of the inventive concepts disclosed herein.
Figure 5B:
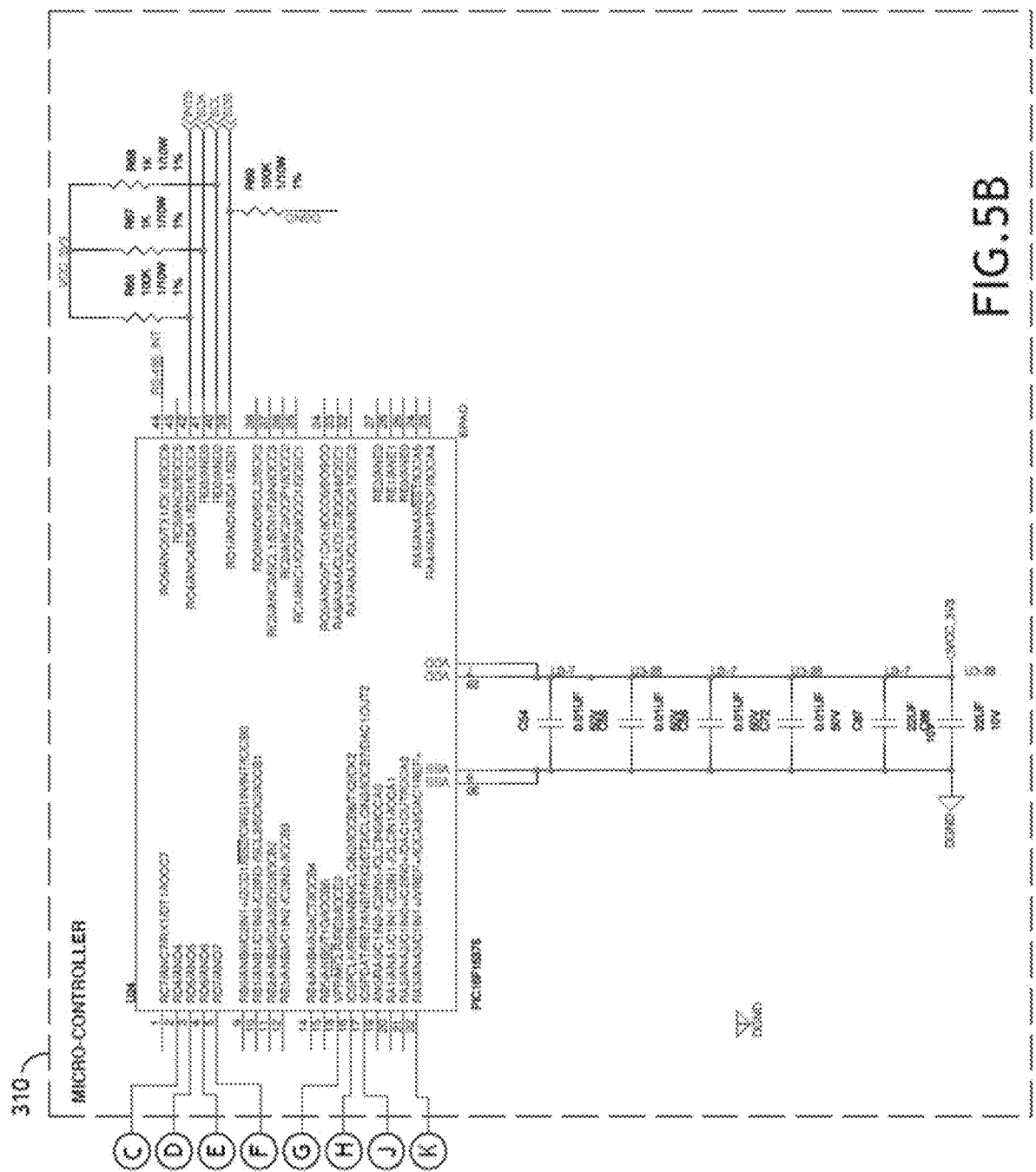

Referring now to FIGS. 5A and 5B, schematic diagrams of a variable geometry light source exemplary of one embodiment of the inventive concepts disclosed herein is shown. Inputs E4-E10 are similar in function to power reference inputs 426 where a user may press a button for an exemplary light up command using button E4 and an exemplary light radius up using button E7. As the user may impact a specific button the microcontroller 310 may recognize that command and command the dense array of LED 180 to function accordingly.

For example, one set of programming of the E4-E10 inputs may include an on, off, bright, dim or a left, right, up, down. Another may include an increase in spot size or decrease in spot size as well as a sequence through different desired shapes. The function of each of the inputs may be limited only by programming of the microcontroller 310 via the program pins 160.

FIG. 5B details the microcontroller 310 retaining instructions for function available to the variable geometry light source 110. The microcontroller 310 may house resident software to operate the variable geometry light source 110. Storage 316 may function to provide the microcontroller 310 with instruction available for operation. Programming instructions to control the dense array of LED 180, circuitry available for calibration, temperature compensation, input output control and communications to an outside source may be included within the microcontroller 310.

In operation, the microcontroller 310 may receive a user input; and produce an illumination data signal based on the user input. The illumination data signal force the drivers 130 140 to blink each LED in compliance with a pulse width modulated (PWM) signal. This PWM signal may allow function of the dense array of LED 180 to illuminate or extinguish to produce an overall illumination 118 in accordance with the illumination data signal. For example, a dim illumination 118 may be accomplished via extinguishing certain LED within the array 180 to provide a shaped illumination.

In one embodiment of the inventive concepts disclosed herein, a communication port labeled RS485 may function to provide input to the microcontroller 310.

FIG. 6

Figure 6:
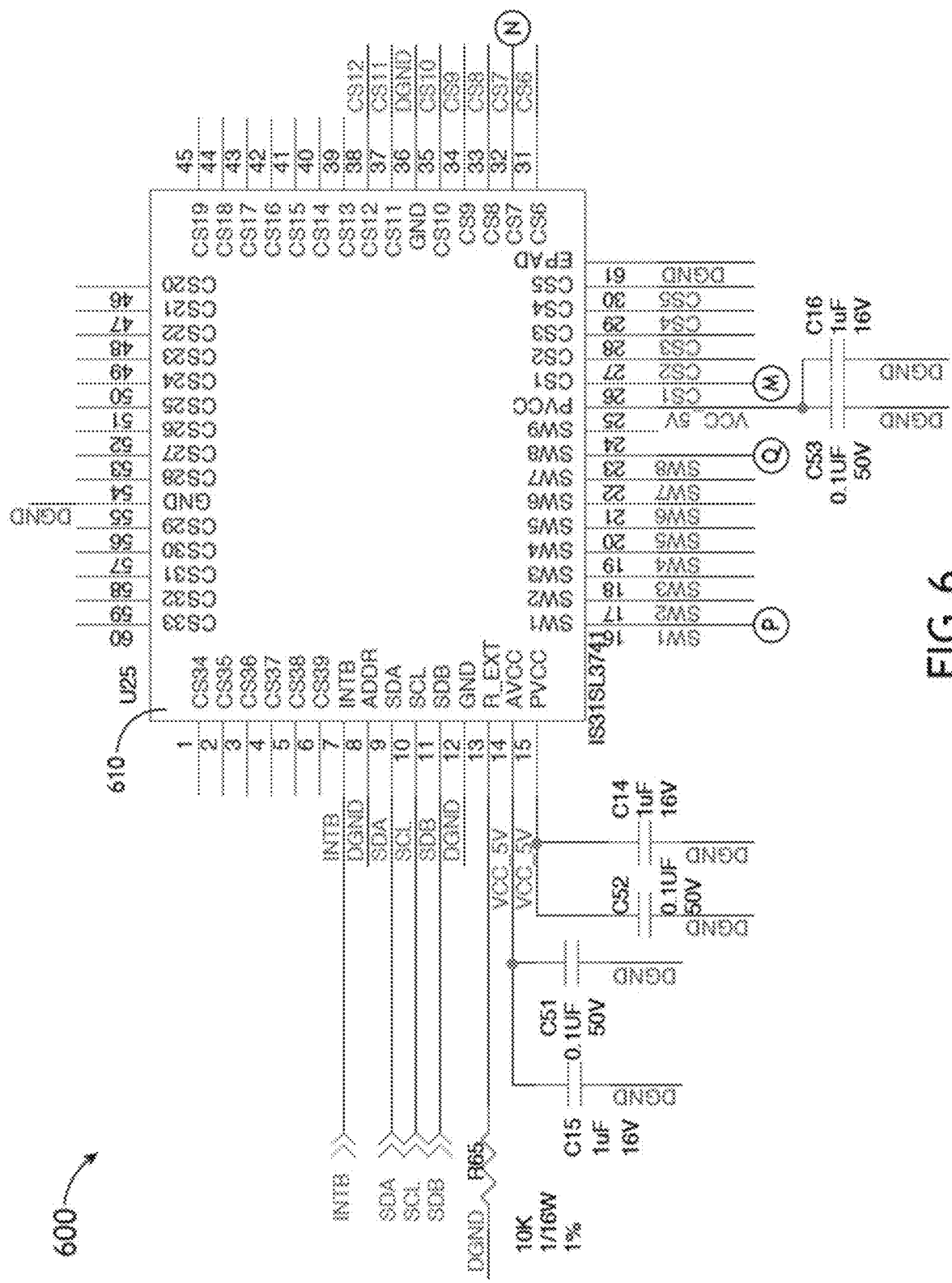
FIG. 6 is a diagram of an exemplary driver microcontroller in accordance with one embodiment of the inventive concepts disclosed herein.

Referring now to FIG. 6, a diagram of an exemplary driver microcontroller in accordance with one embodiment of the inventive concepts disclosed herein is shown. Side view 600 of an exemplary microcontroller driver 610 may indicate the inputs and outputs available to the microcontroller driver 610 for function within the variable geometry light source 110.

FIG. 7A-7B

Figure 7A:
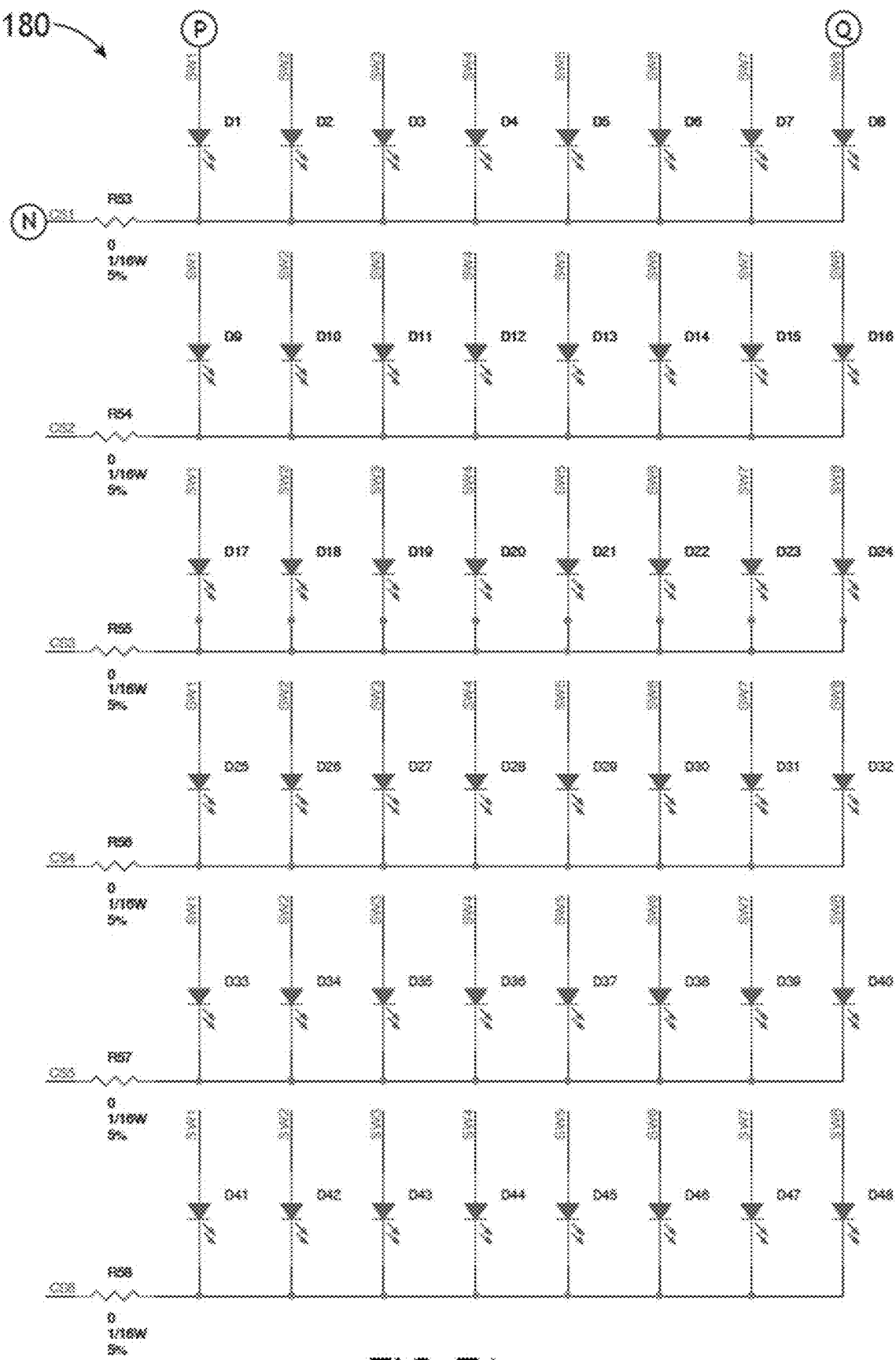
FIG. 7A-7B are diagrams of a dense array of LED associated with one embodiment of the inventive concepts disclosed herein.
Figure 7B:
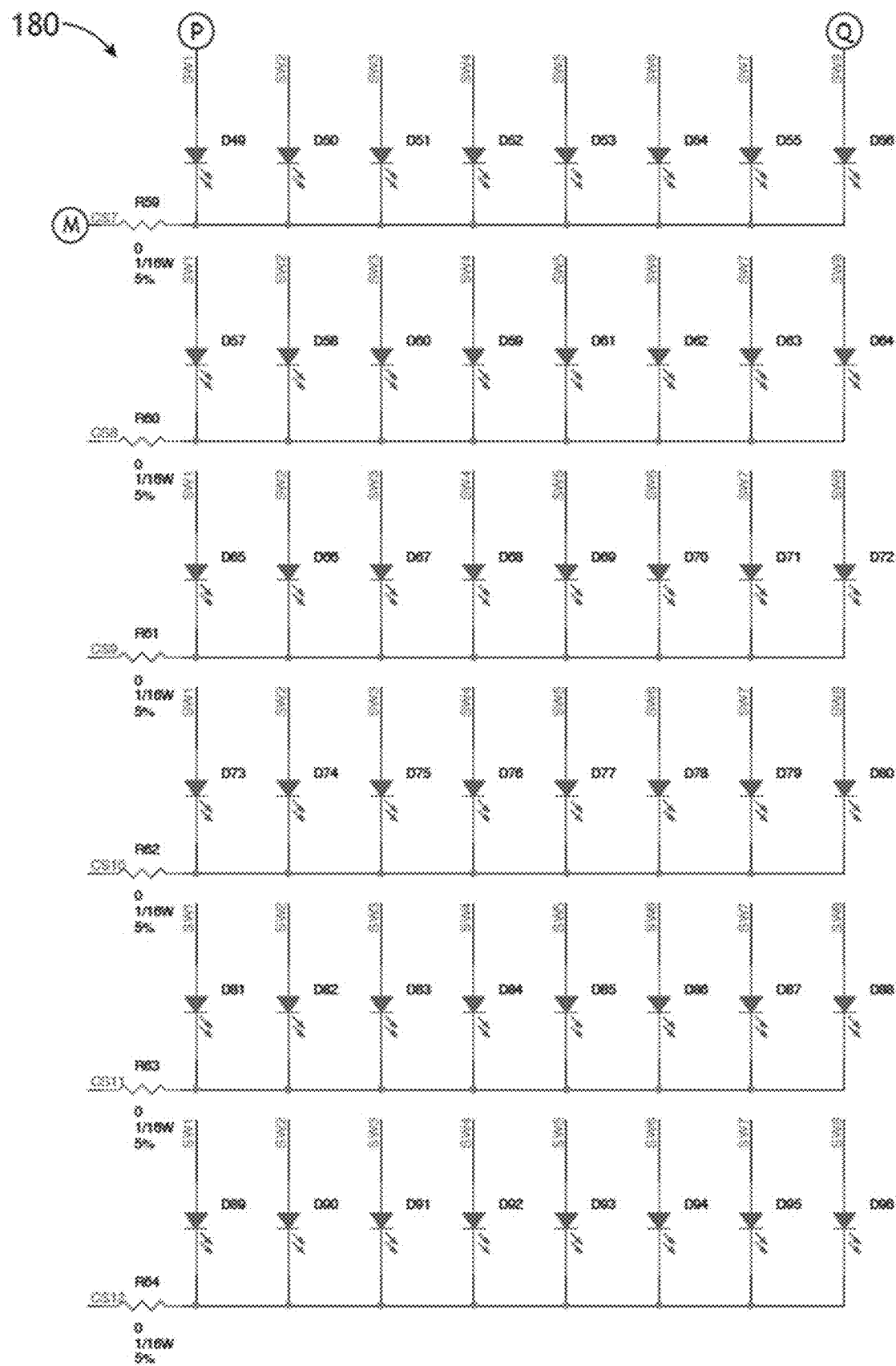
Figure 8A:
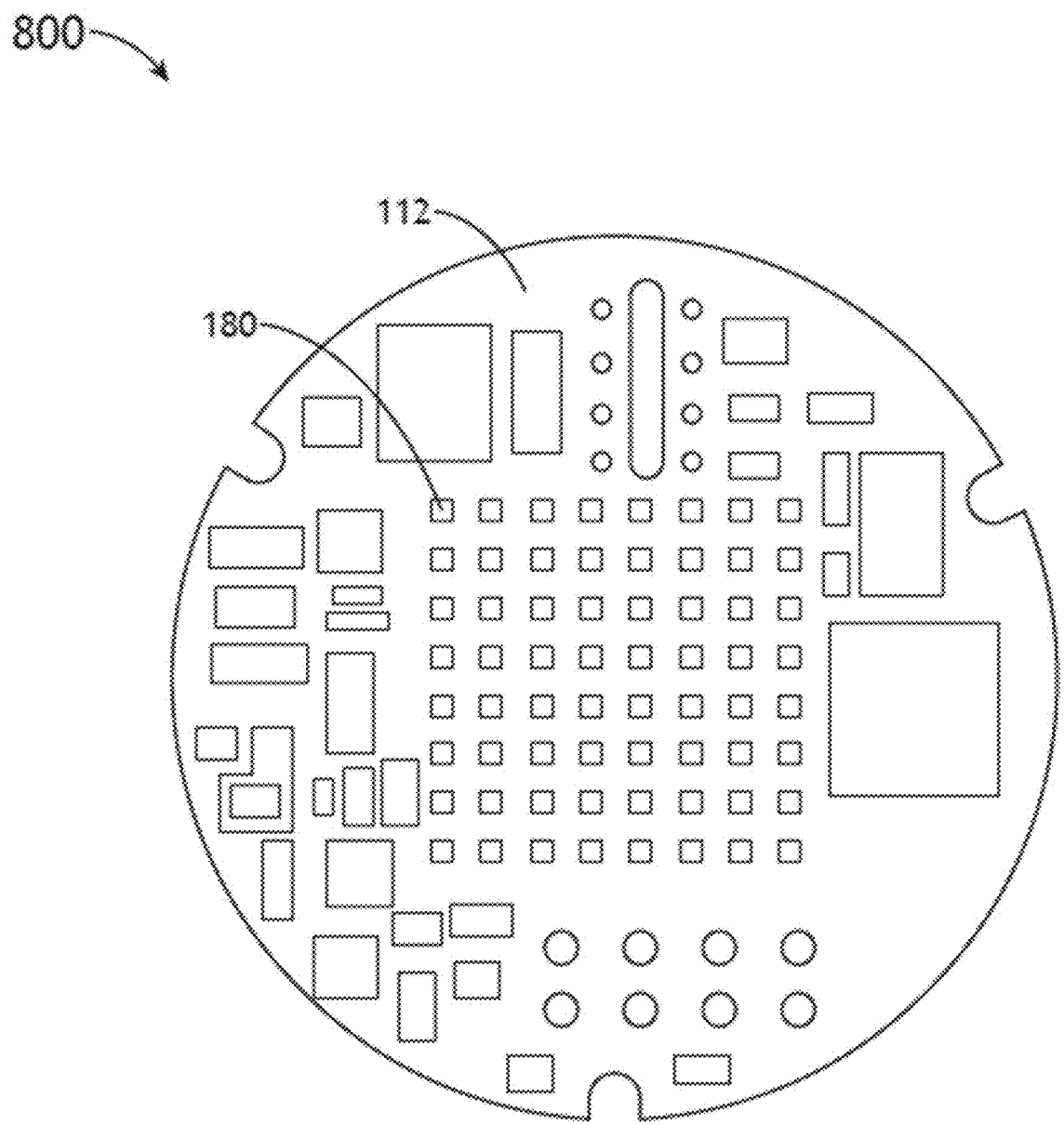
FIG. 8A-8G are diagrams of a PCB with various patterns of illumination of the variable geometry light source exemplary of one embodiment of the inventive concepts disclosed herein.
Figure 8B:
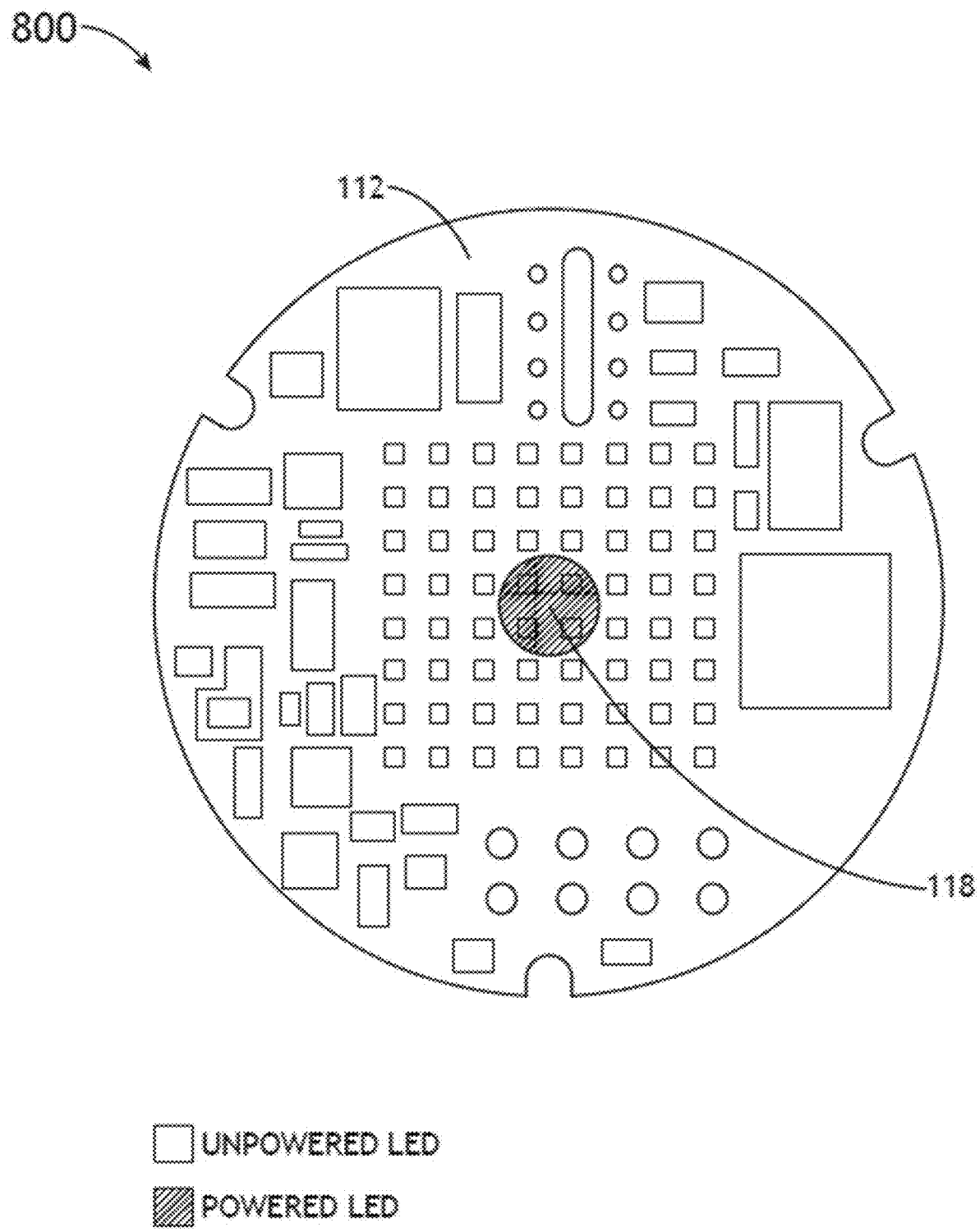
Figure 8C:
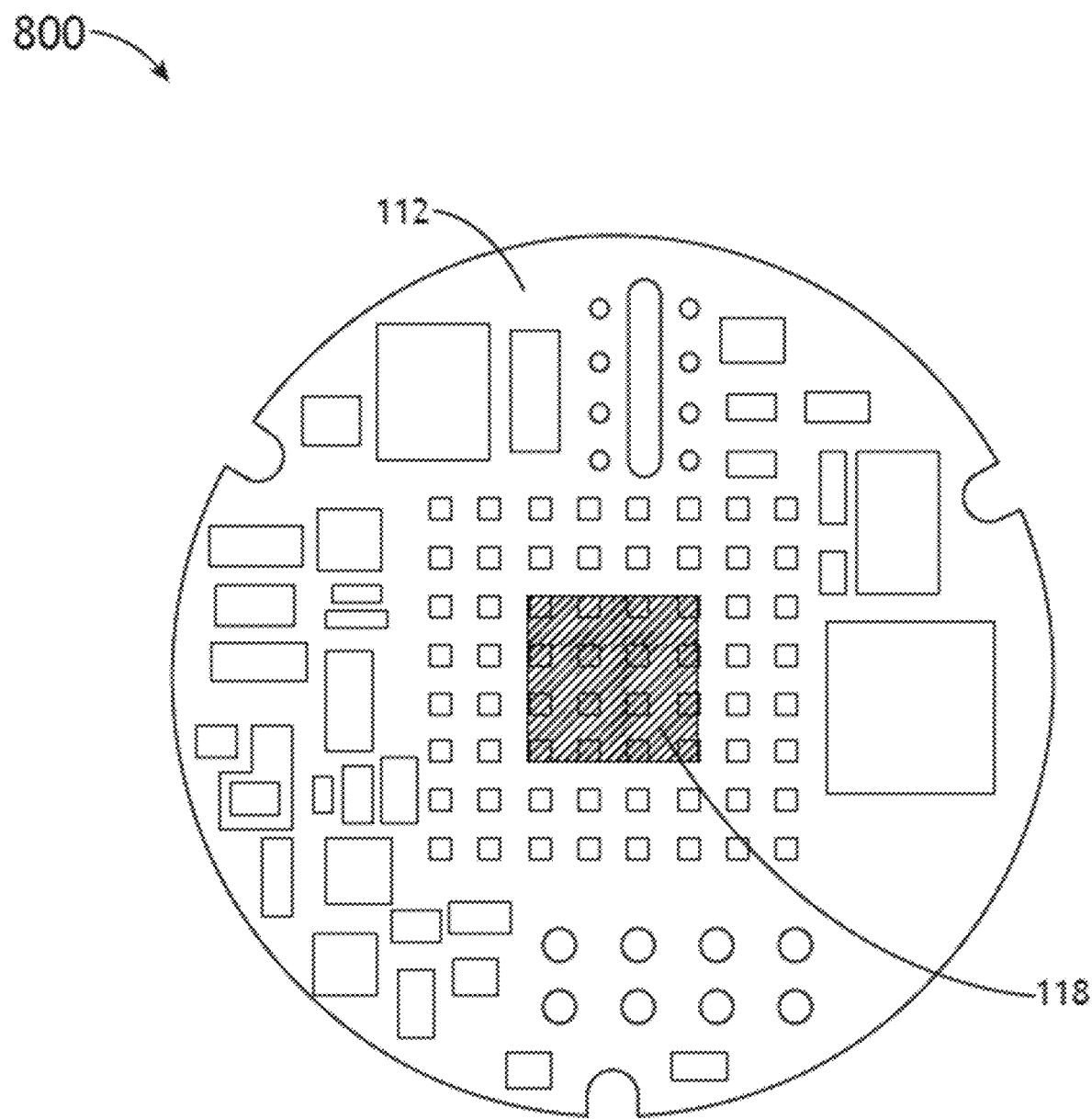
Figure 8D:
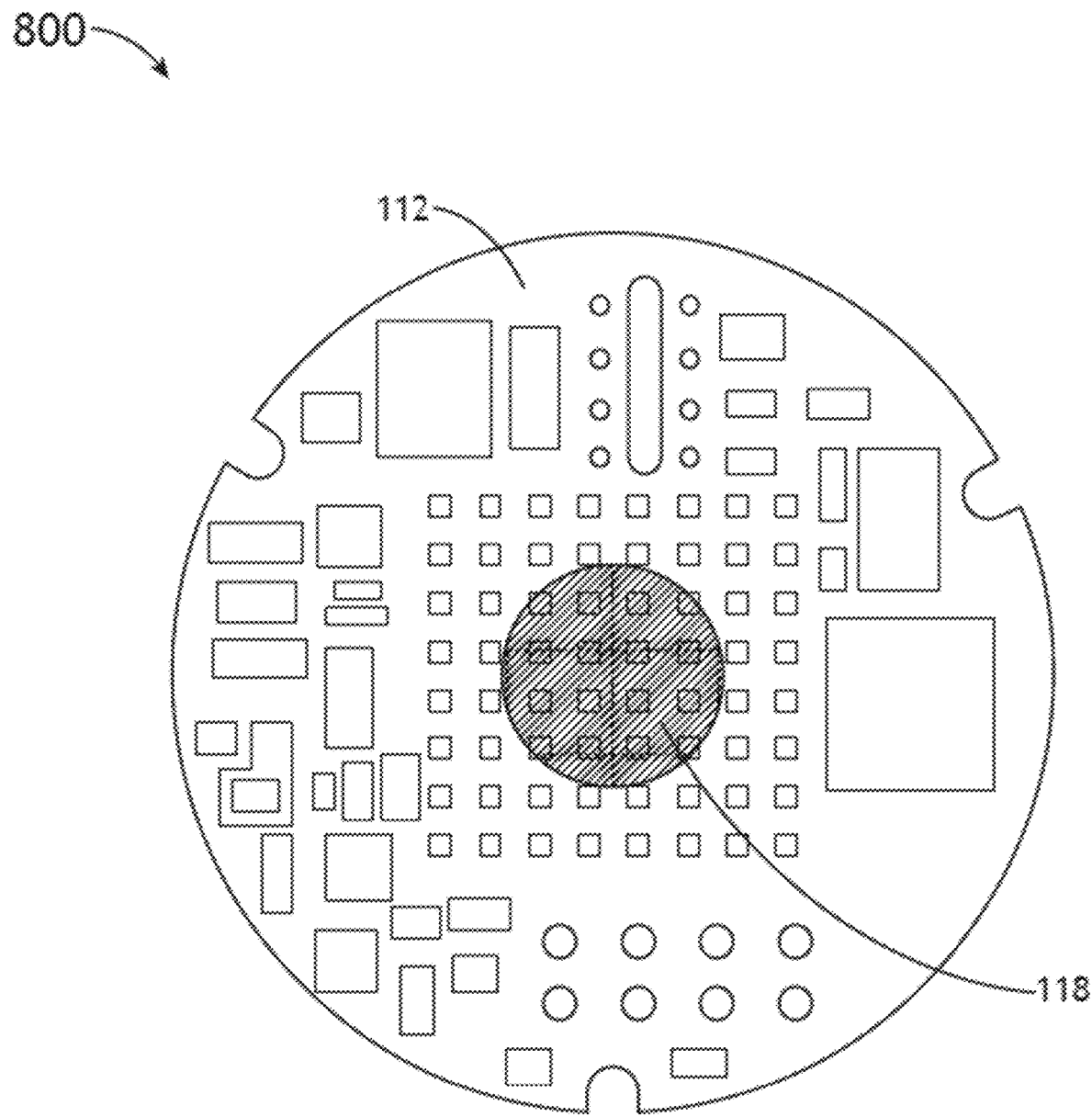
Figure 8E:
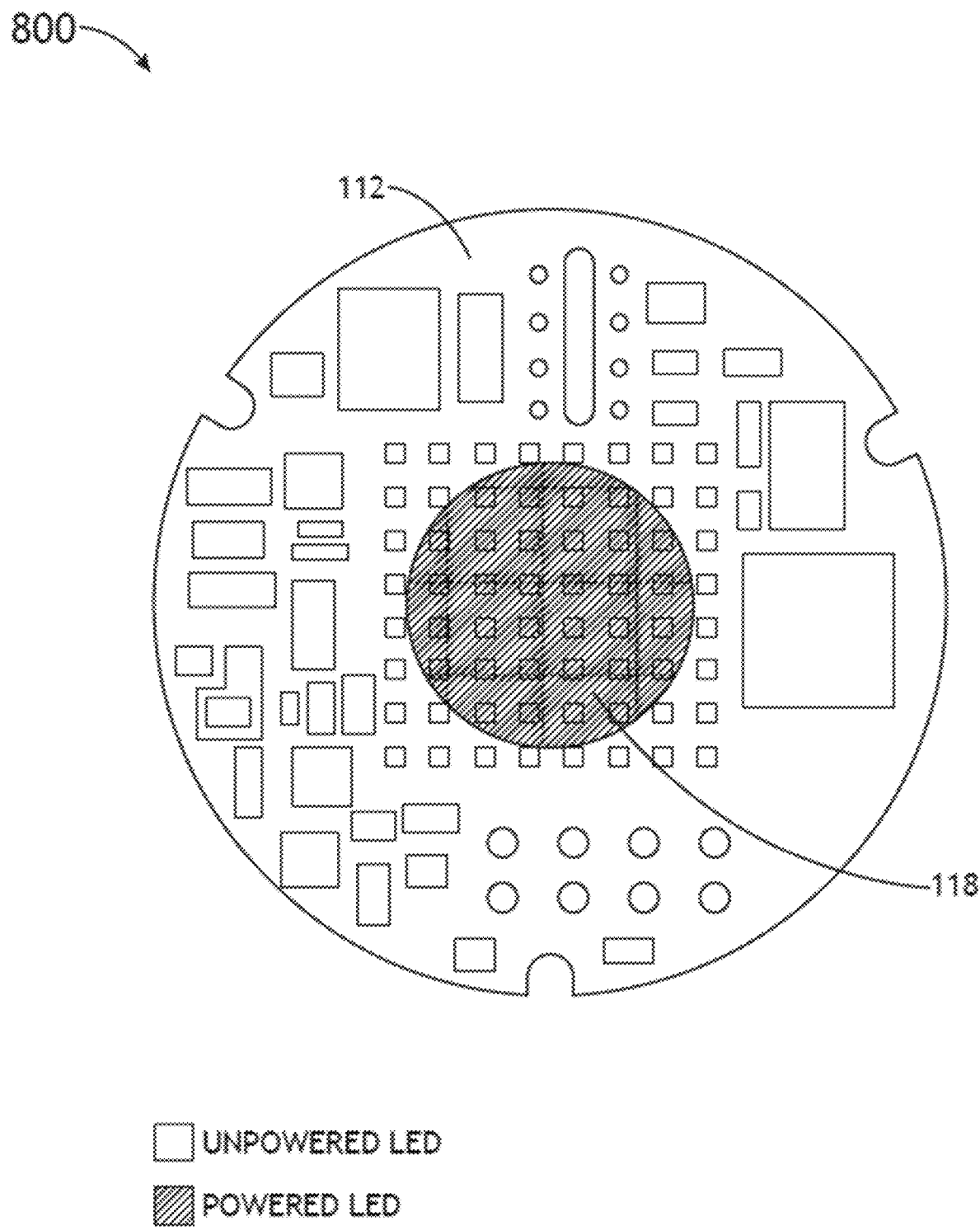
Figure 8F:
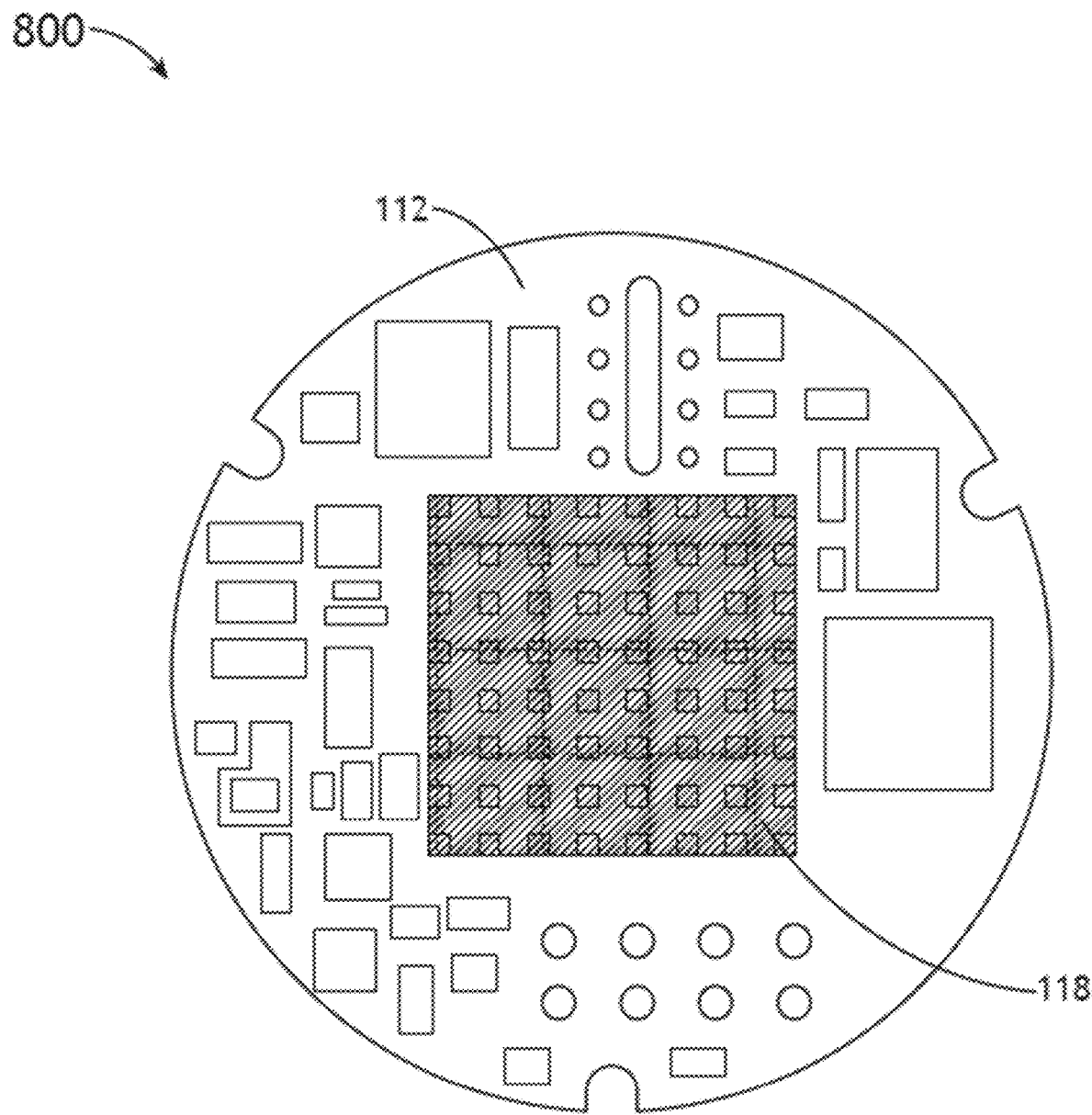
Figure 8G:
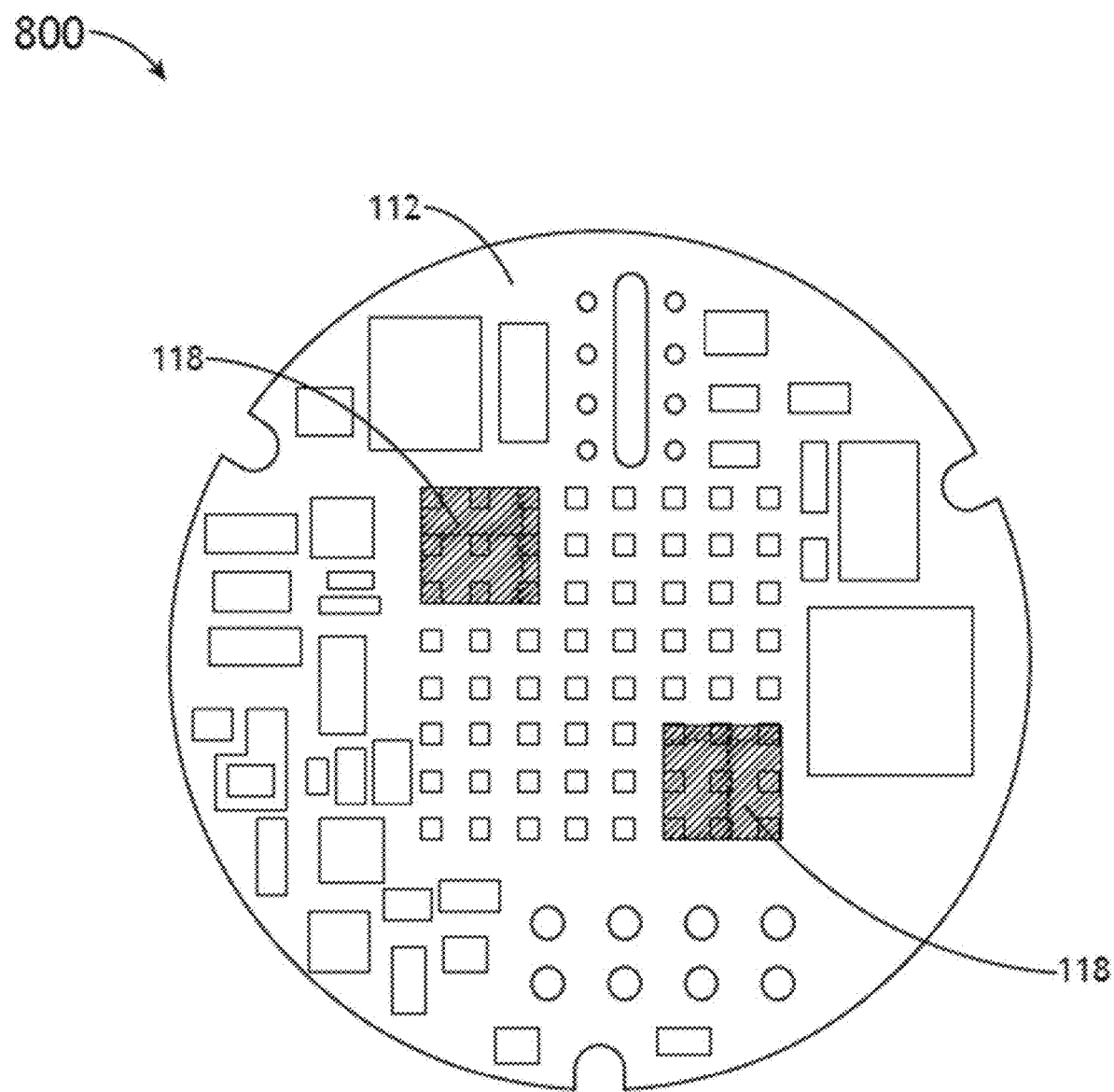

Referring now to FIGS. 7A and 7B, diagrams of a dense array of LED associated with one embodiment of the inventive concepts disclosed herein is shown. The dense array 180 may provide the illumination 118 controlled by the microcontroller 310.

FIG. 8A-8G

Referring generally now to FIGS. 8A-8G, a diagrams of a PCB with various patterns of illumination of the variable geometry light source exemplary of one embodiment of the inventive concepts disclosed herein is shown. Sequence 800 may indicate exemplary function of the dense array of LED 180 available to variable geometry light source 110. With each LED unpowered in FIG. 8A, the illumination 118 is off. As a user may make inputs via the power inputs 150, the dense array 180 may operate to confirm to the illumination data signals of the microprocessor 310.

FIG. 9A-9C

Figure 9A:
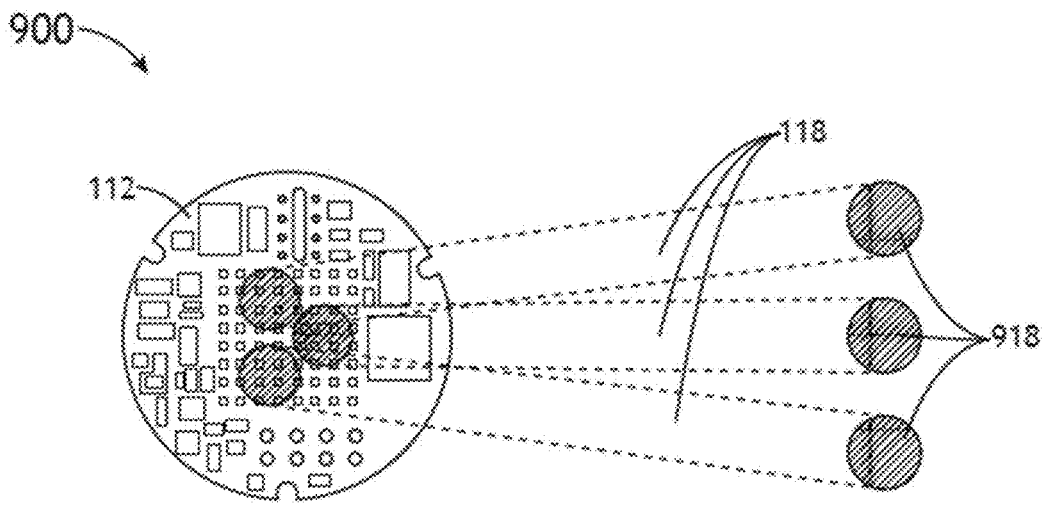
FIG. 9A-9C are diagrams of illumination patterns associated with one embodiment of the inventive concepts disclosed herein.
Figure 9B:
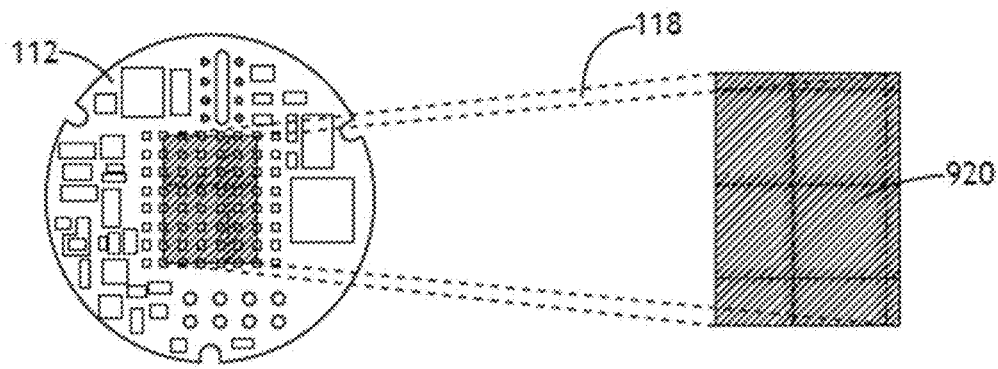
Figure 9C:
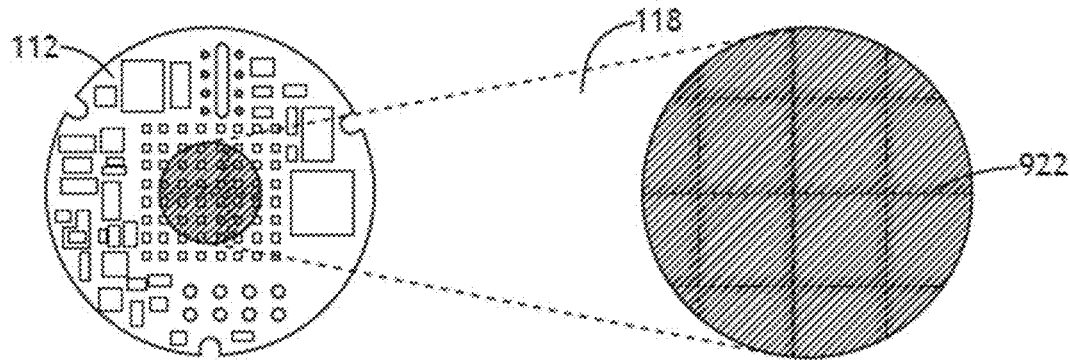
Figure 10A:
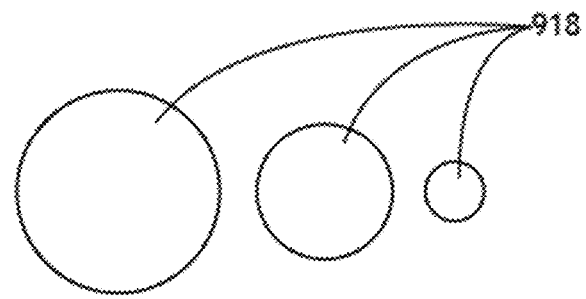
FIG. 10A-10I are diagrams of illumination patterns associated with one embodiment of the inventive concepts disclosed herein.
Figure 10B:
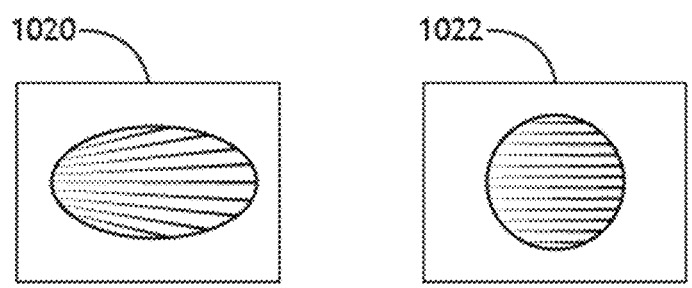
Figure 10C:
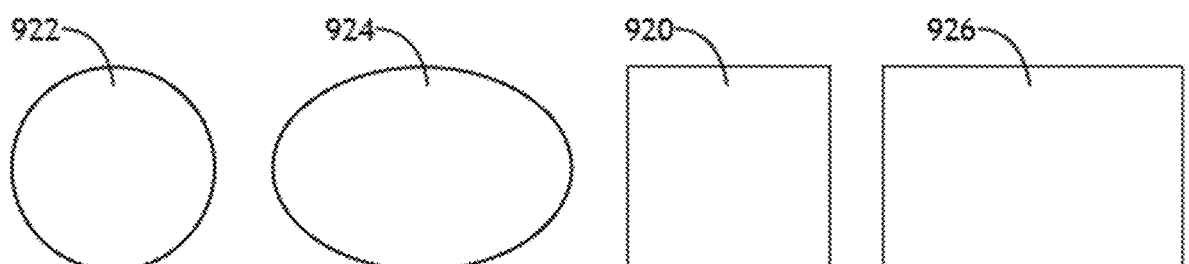
Figure 10D:
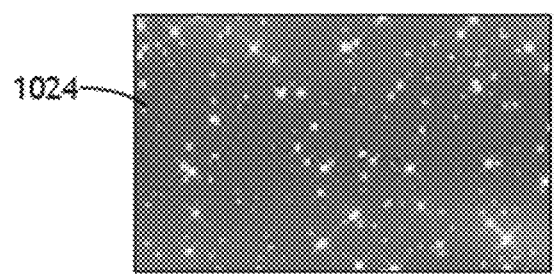
Figure 10E:
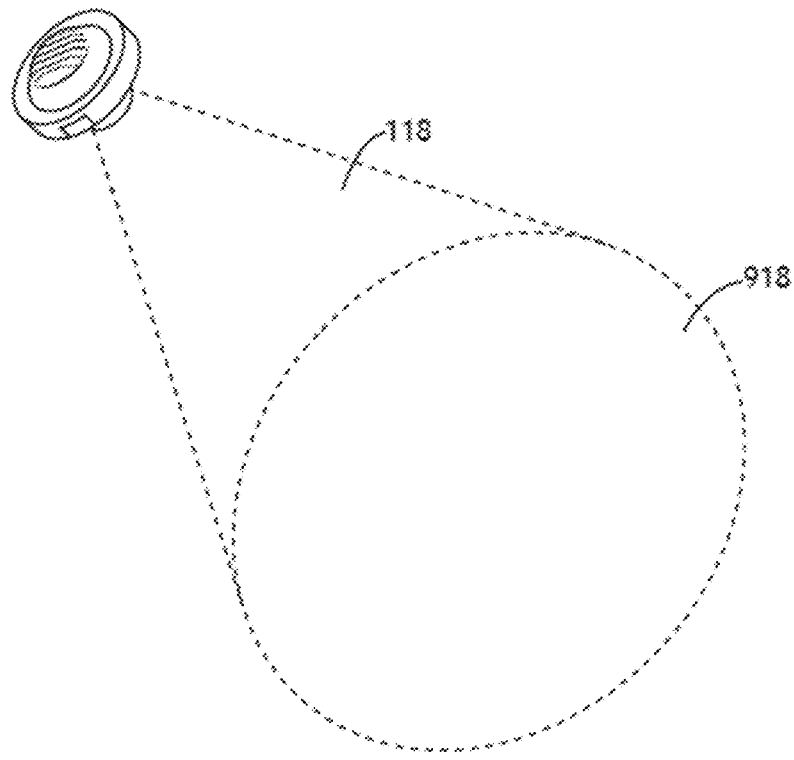
Figure 10F:
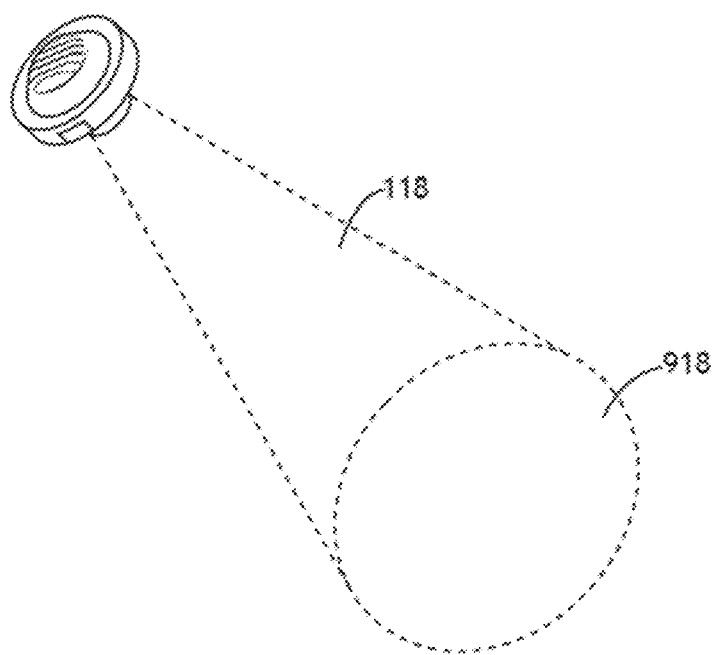
Figure 10G:
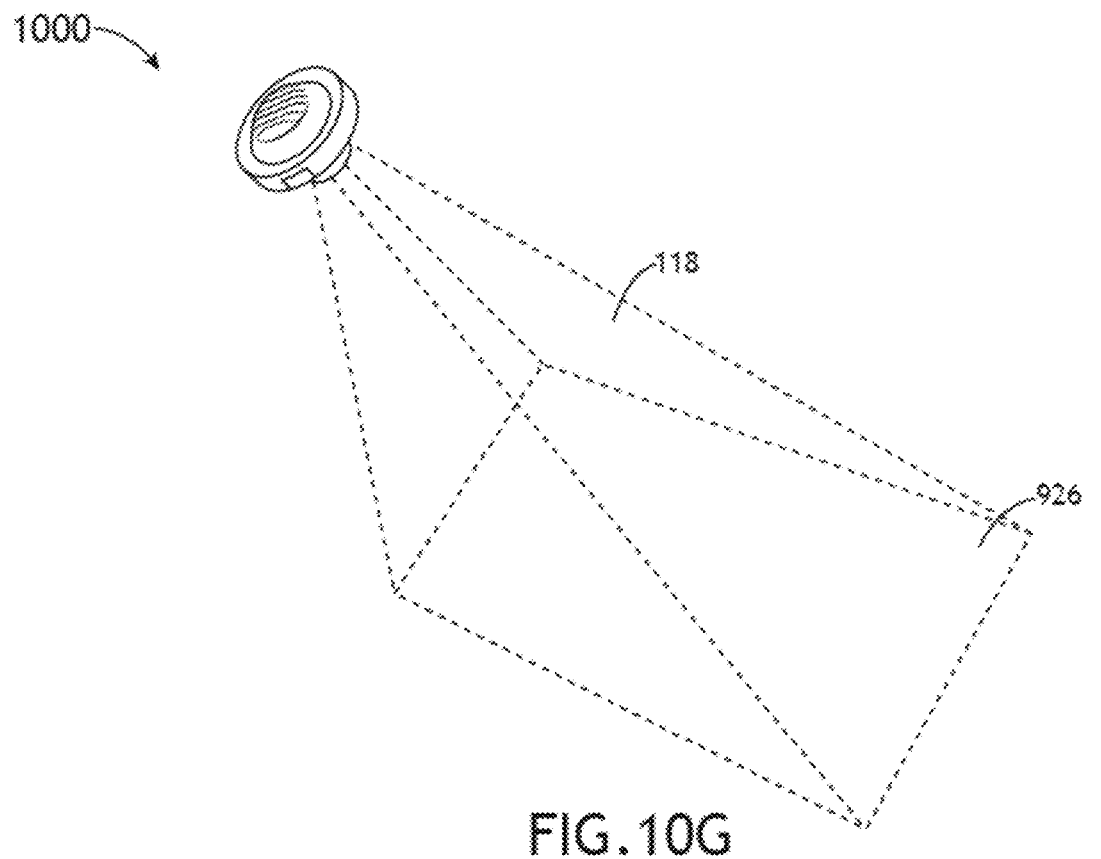
Figure 10H:
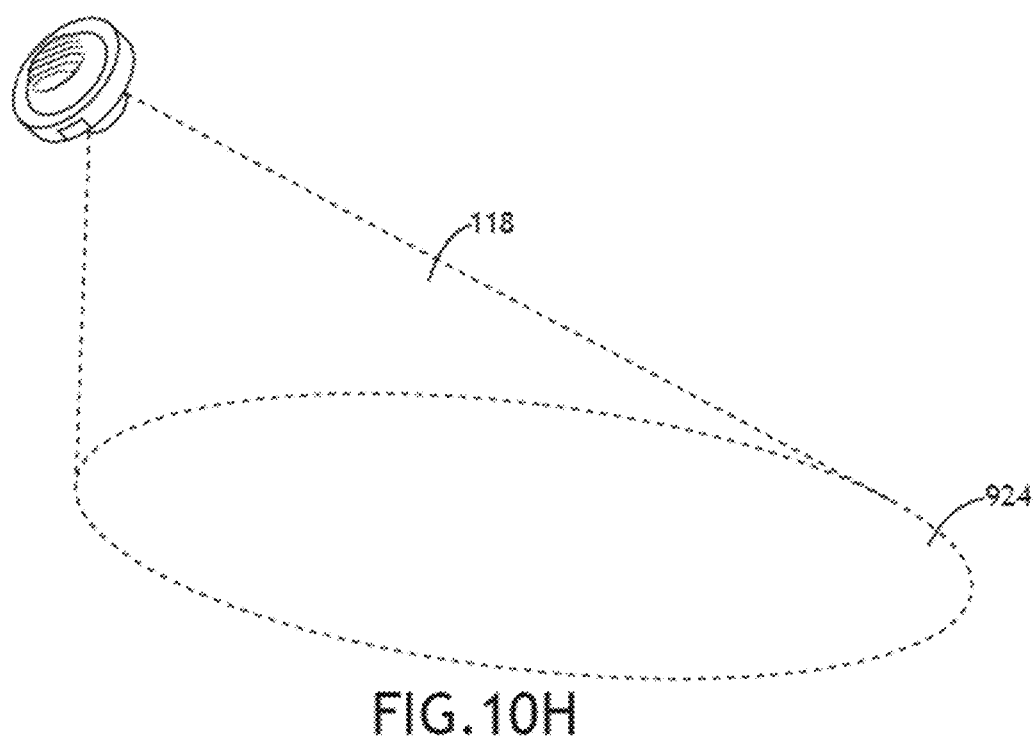
Figure 10I:
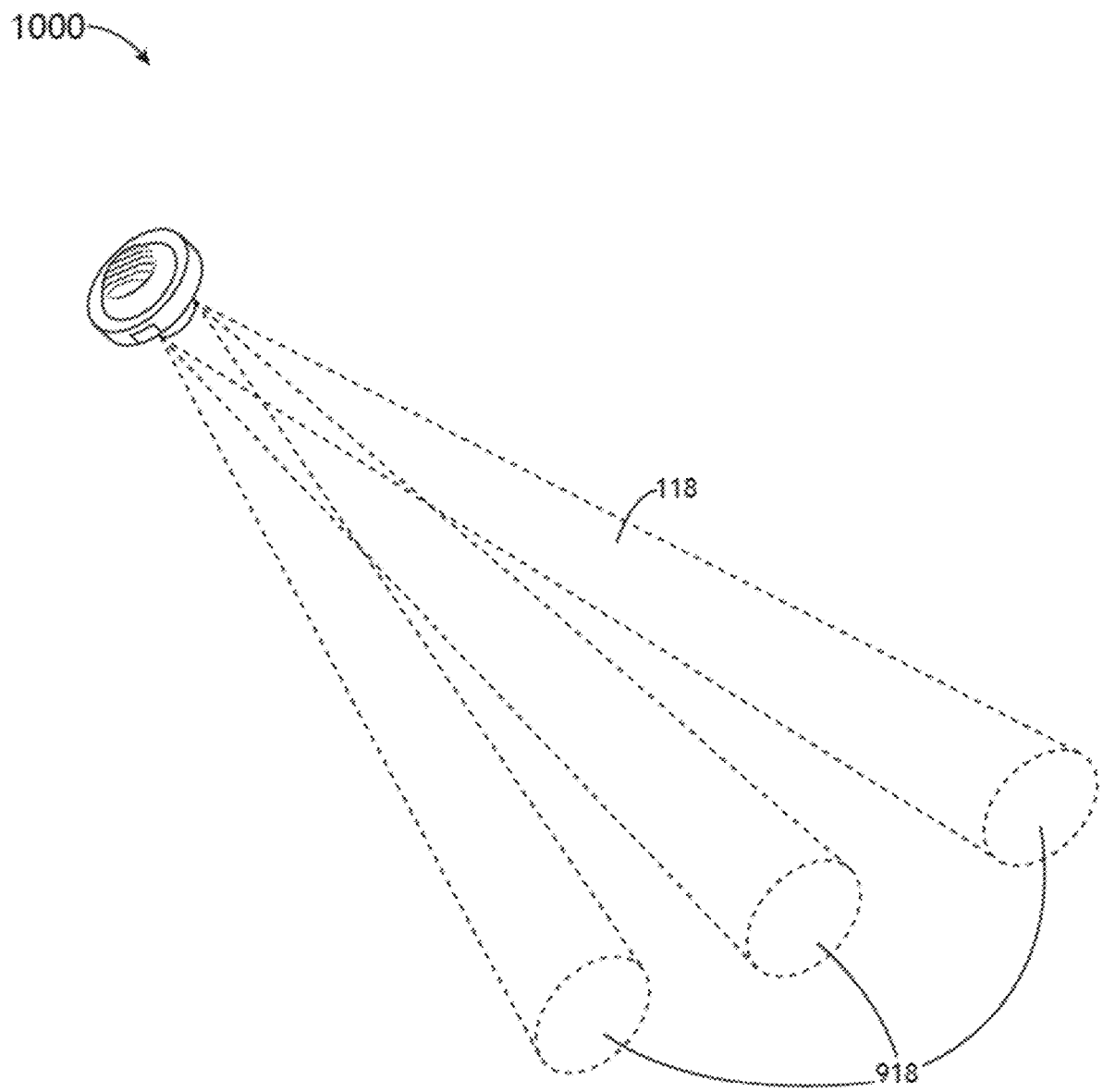

Referring now to FIGS. 9A-9C, a diagrams of illumination patterns associated with one embodiment of the inventive concepts disclosed herein is shown. Sequence 900 may indicate a circular multiple pattern 918, a square pattern 920, and a single circle pattern 922.

FIG. 10A-10J

Referring now to FIGS. 10A-10D, diagrams of illumination patterns associated with one embodiment of the inventive concepts disclosed herein is shown. The flexible sizes available to the variable geometry light source 110 may be indicated as circular multiple patterns 918. Without correction, the illumination pattern may indicate an angled pattern 1020. However, in one embodiment of the inventive concepts disclosed herein, the variable geometry light source 110 may operate to create a focused angled pattern 1022 while projecting at any angle. Oval patterns 924 and rectangle pattern 926 are also available to the variable geometry light source 110.

Specialty patterns such as a starlight pattern 1024 may be projected by the variable geometry light source 110.

Additional FIGS. 10E-10J indicate additional options for the variable geometry light source 110. In one embodiment, the individual variable geometry light source 110 may illuminate more than one area (e.g., three aircraft seats) with individual control of the spots. In this manner, an operator may reduce the total number of fixtures required in an aircraft cabin.

FIG. 11

Figure 11:
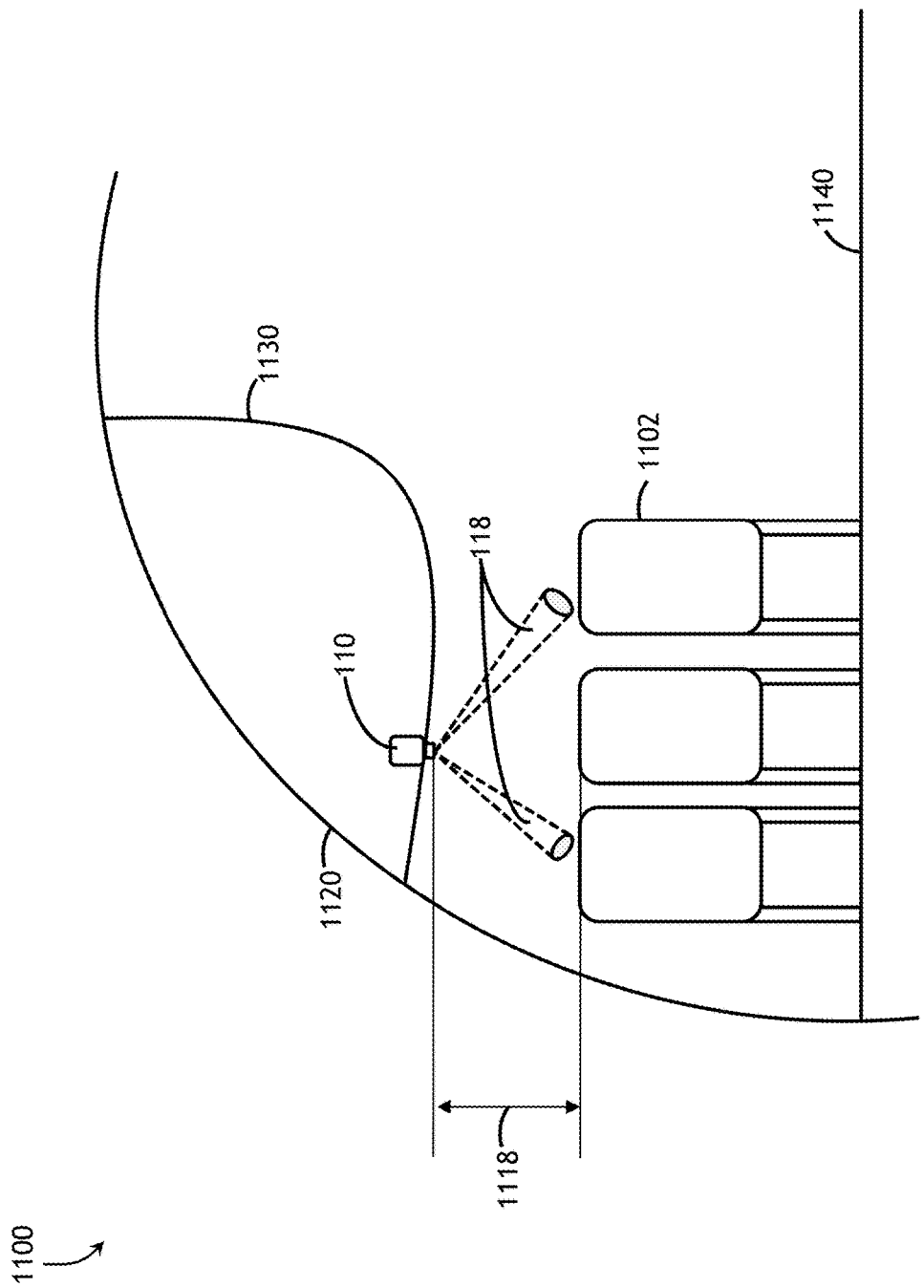
FIG. 11 is a diagram of an internal aircraft cabin in accordance with one embodiment of the inventive concepts disclosed herein.

Referring now to FIG. 11, a diagram of an internal aircraft cabin in accordance with one embodiment of the inventive concepts disclosed herein is shown. Longitudinal view 1100 may indicate a single aisle aircraft. An aircraft exterior 1120, aircraft passenger floor 1140, overhead panel 1130 aircraft seats 1102 may comprise hardware found onboard an aircraft.

A focus length 1118 may be a desired length for a spot size to illuminate a desired subject. On a single aisle aircraft, the focus length 1118 may be a relatively small value while on a larger twin aisle aircraft the focus length may be greater. Creating a brighter spot illumination may be as simple as illuminating additional LED within the dense array of LED 180. Creating a more focused spot may be accomplished by a reduction of illuminated LED within the array 180.

FIG. 12

Figure 12:
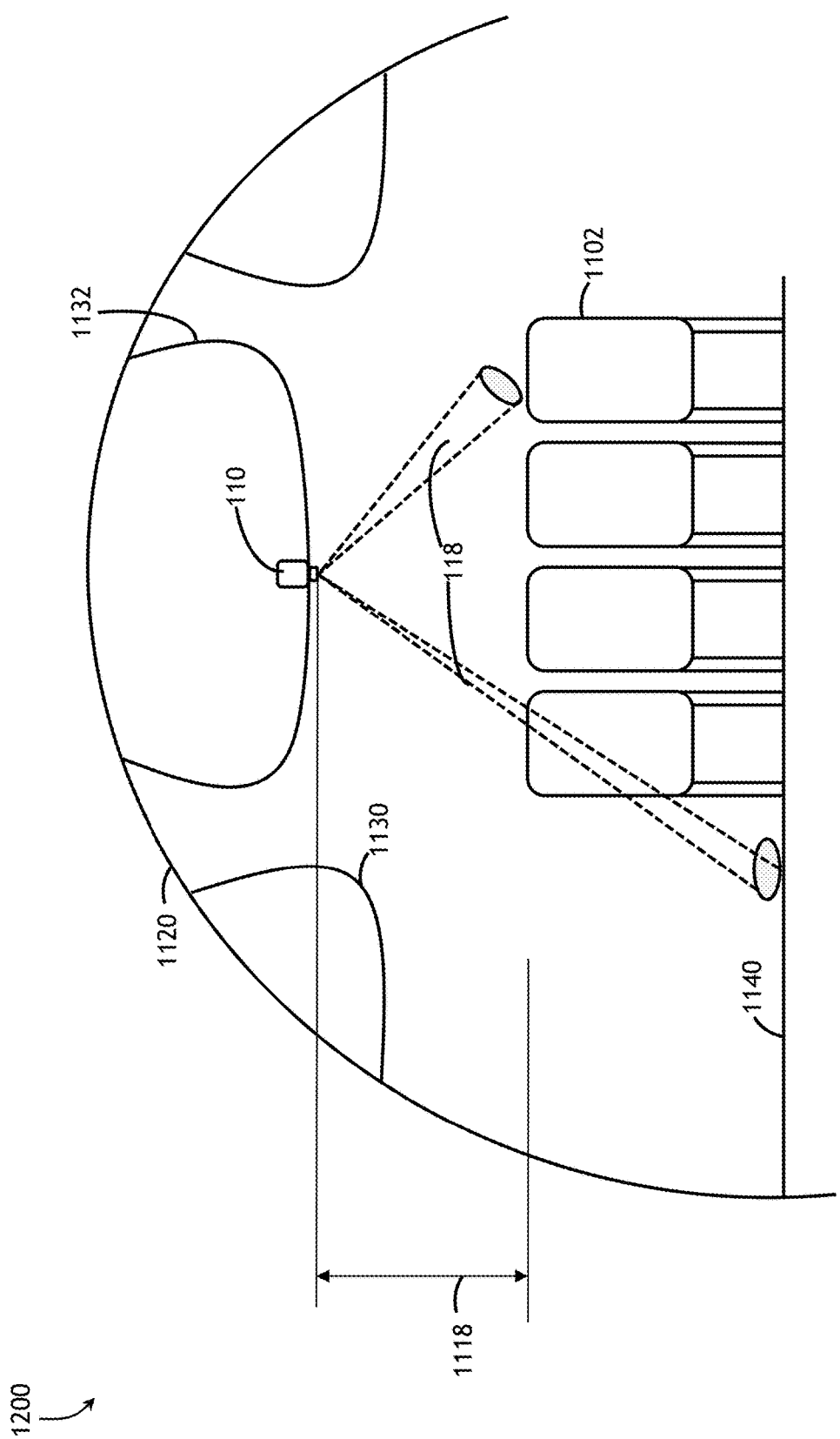
FIG. 12 is a diagram of a double aisle aircraft cabin associated with one embodiment of the inventive concepts disclosed herein.

Referring now to FIG. 12, a diagram of a double aisle aircraft cabin associated with one embodiment of the inventive concepts disclosed herein is shown. A greater focus length 1118 may be found within a dual aisle aircraft shown in view 1200. Within center overhead panel 1132, the variable geometry light source 110 may project the illumination 118 to a passenger seat or upon the aircraft passenger deck 1140.

FIG. 13

Figure 13:
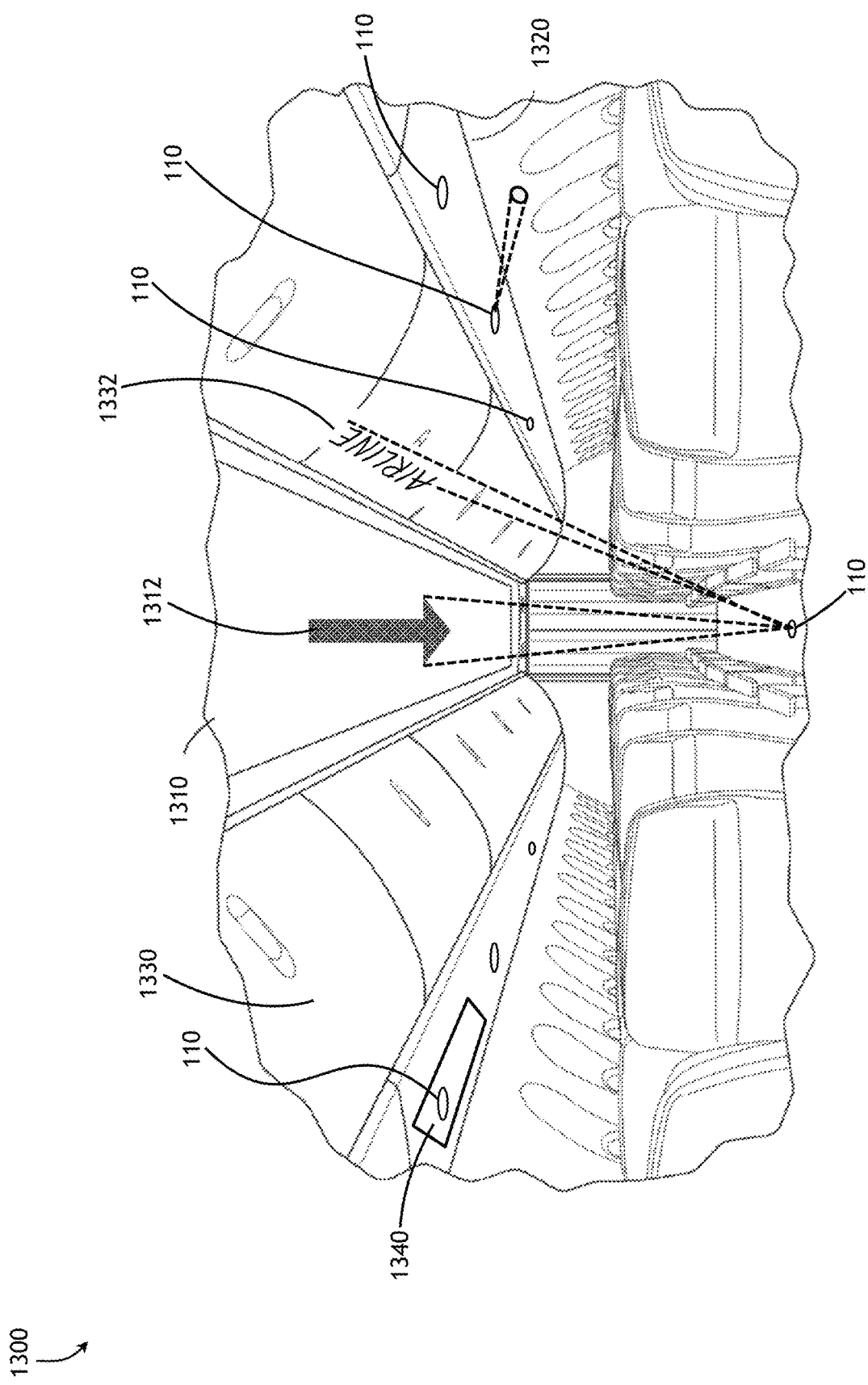
FIG. 13 is an isometric view of one embodiment of the inventive concepts disclosed herein.

Referring now to FIG. 13, a isometric view of one embodiment of the inventive concepts disclosed herein is shown.

In one embodiment of the inventive concepts disclosed herein, the variable geometry light source 110 may offer a substitute for general aircraft cabin lighting. In this manner, a single part number may replace each cabin light and function to project an illumination in a desired direction and intensity. For example, a logo light projection 1332 on an overhead bin 1330 may function to communicate with a viewer. In addition, an egress presentation 1312 projected on an overhead ceiling 1310 may offer a passenger egress instruction.

In addition, the variable geometry light source 110 may project an animated presentation for communication with the passenger. Contemplated herein, animated words and symbols may direct passengers to the lavatory, emergency exit and normal exit.

The variable geometry light source 110 may further project on a side panel 1320 eliminating the need for additional side panel lighting. Within a Passenger service unit (PSU) 1340 the variable geometry light source 110 may offer a reading light to a passenger seated in the aircraft seat 1102.

FIG. 14

Figure 14:
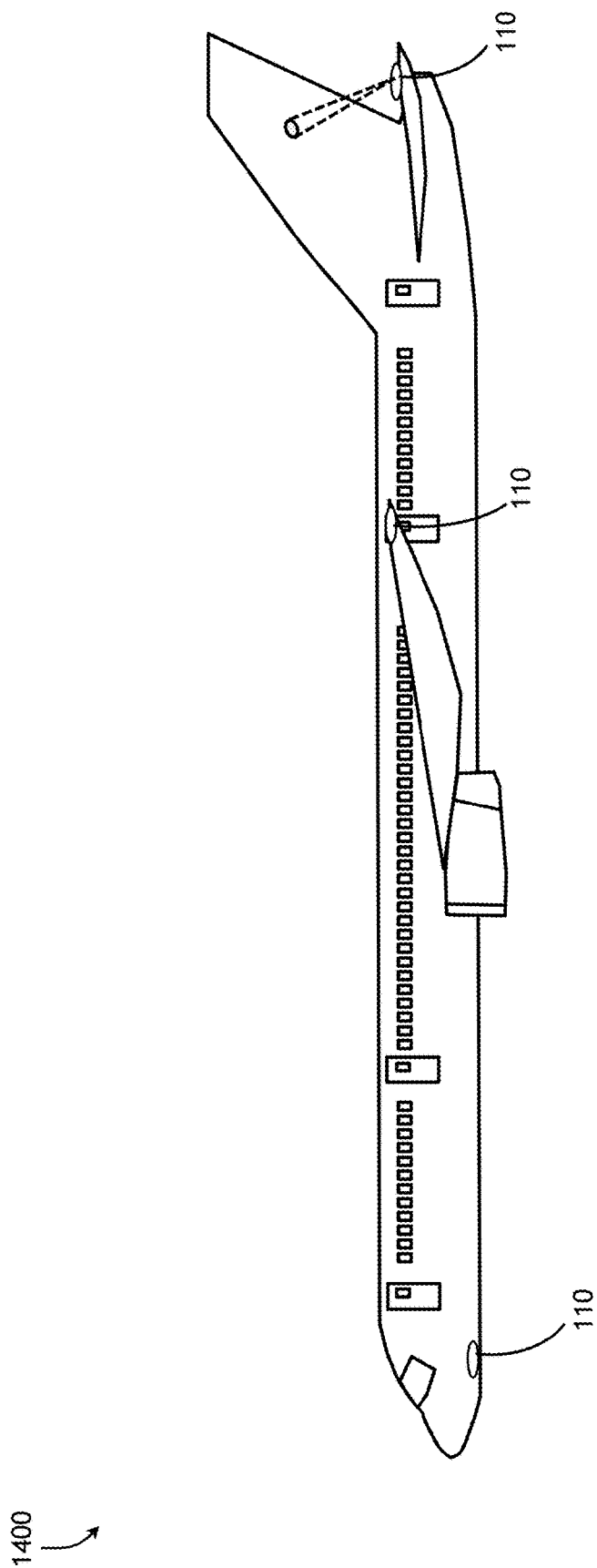
FIG. 14 is a side view of an aircraft fitted with one embodiment of the inventive concepts disclosed herein.

Referring now to FIG. 14, a side view of an aircraft fitted with one embodiment of the inventive concepts disclosed herein is shown. A taxi light, logo light and anti-collision light may be replaced by the variable geometry light source 110 to function as regulated light sources.

FIG. 15

Figure 15:
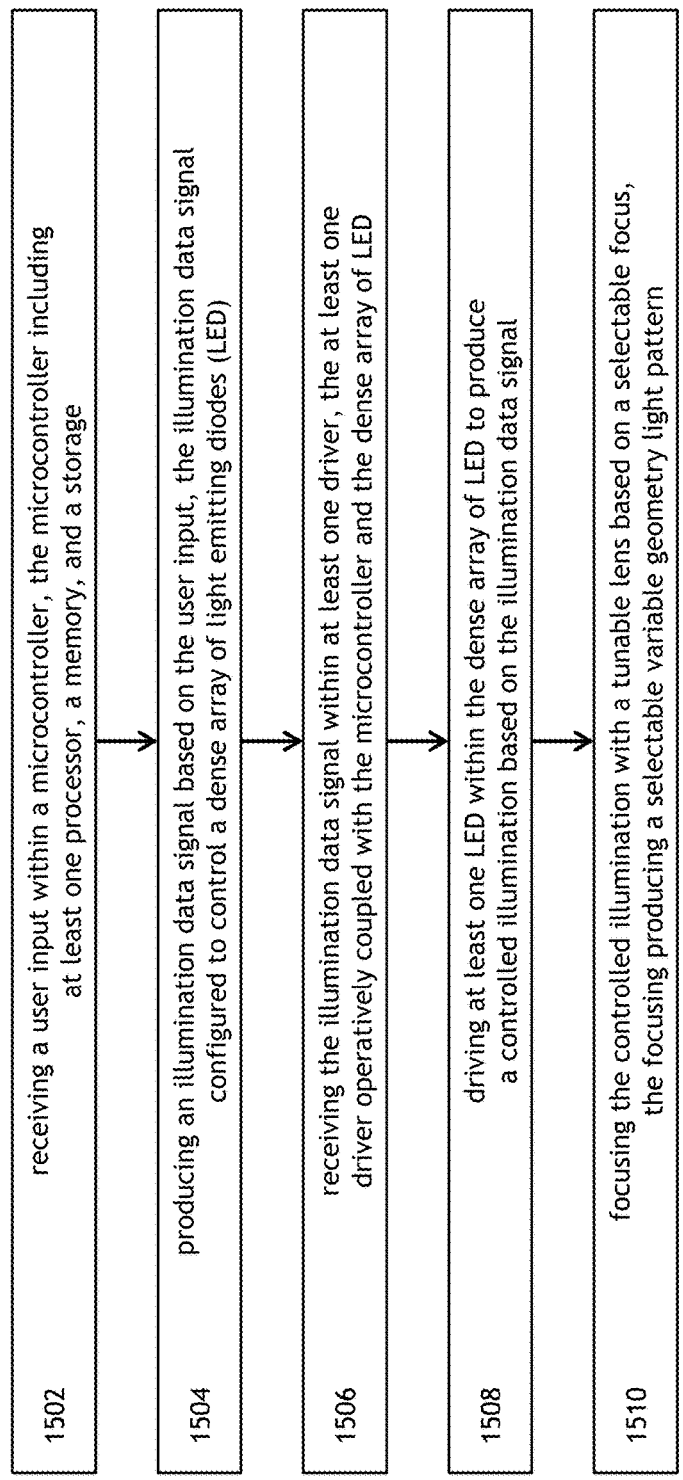
FIG. 15 is a flowchart for a method for illuminating a subject associated with one embodiment of the inventive concepts disclosed herein.

Referring now to FIG. 15, a flowchart for a method for illuminating a subject associated with one embodiment of the inventive concepts disclosed herein is shown.

A step 1502 may include receiving a user input within a microcontroller, the microcontroller including at least one processor, a memory, and a storage. A step 1504 may include producing an illumination data signal based on the user input, the illumination data signal configured to control a dense array of light emitting diodes (LED).

A step 1506 may include receiving the illumination data signal within at least one driver, the at least one driver operatively coupled with the microcontroller and the dense array of LED and a step 1508 may include driving at least one LED within the dense array of LED to produce a controlled illumination based on the illumination data signal. A step 1510 may include focusing the controlled illumination with a tunable lens based on a selectable focus, the focusing producing a selectable variable geometry light pattern.

CONCLUSION

As will be appreciated from the above, a variable geometry light source according to embodiments of the inventive concepts disclosed herein may have function to provide a projectable illumination to enhance or replace light sources currently in place within a plurality of applications.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A variable geometry light source, comprising:
an upper housing;
a lower housing connected to the upper housing;
a single printed circuit board located within the upper housing and the lower housing, the single printed circuit board including:
a microcontroller, the microcontroller including at least one processor, a memory, and a storage;
a power receiver operatively coupled with the microcontroller configured for:
receiving an electrical power; and
supplying a regulated portion of the electrical power to at least one component of the variable geometry light source;
an array of light emitting diodes (LED), the array of light emitting diodes operatively coupled with the microcontroller and the power receiver, the array of light emitting diodes configured for producing a controlled illumination; and
at least one driver, the at least one driver operatively coupled with the microcontroller, the array of LED, and the power receiver, configured for:
receiving the regulated portion of electrical power;
receiving the illumination data signal; and
driving at least one LED within the dense array of LED to produce the controlled illumination based on the illumination data signal;
a tunable lens located within the lower housing;
an outer lens connected to the lower housing; and
a handle connected to the lower housing; the handle configured to adjust a direction of the controlled illumination.

2. The variable geometry light source of claim 1, wherein the at least one driver is a metal-oxide semiconductor field-effect transistor (MOSFET) configured to individually control each LED of the dense array of LED.

3. The variable geometry light source of claim 1, wherein the at least one driver is a second microcontroller configured to individually control each LED of the dense array of LED.

4. The variable geometry light source of claim 1, wherein the variable geometry light source is sized to maintain an outside diameter of 1.5 inches or less.

5. The variable geometry light source of claim 1, wherein the selectable variable geometry light pattern is configured to replace at least one required illumination source within a cabin of a vehicle.

6. The variable geometry light source of claim 1, wherein the selectable variable geometry light pattern is configured to replace at least one required illumination source designed to project externally from a vehicle.

7. The variable geometry light source of claim 1, wherein the illumination data signal causes the selectable variable geometry light pattern to produce a word or symbol to a viewer of the pattern.

8. The variable geometry light source of claim 1, wherein the tunable lens maintains a fixed shape as the variable geometry light source is operational.

* * * * *